(12) United States Patent
Tamaki et al.

(10) Patent No.: US 7,089,525 B2
(45) Date of Patent: Aug. 8, 2006

(54) SEMICONDUCTOR DEVICE AND METHOD FOR FABRICATING THE SAME

(75) Inventors: Yoichi Tamaki, Kokubunji (JP); Takayuki Iwasaki, Hitachi (JP); Kousuke Tsuji, Saitama (JP); Chiyoshi Kamada, Kokubunji (JP)

(73) Assignees: Hitachi, Ltd., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 287 days.

(21) Appl. No.: 10/688,975

(22) Filed: Oct. 21, 2003

(65) Prior Publication Data
US 2004/0079996 A1 Apr. 29, 2004

Related U.S. Application Data

(63) Continuation of application No. 10/092,594, filed on Mar. 8, 2002, now Pat. No. 6,662,344.

(30) Foreign Application Priority Data
Mar. 30, 2001 (JP) ............................ 2001-098015

(51) Int. Cl.
*G06F 17/50* (2006.01)

(52) U.S. Cl. ............................... 716/12; 716/2; 716/11
(58) Field of Classification Search ............... 716/1, 716/12, 19, 2, 11; 257/370, 372
See application file for complete search history.

(56) References Cited

U.S. PATENT DOCUMENTS

| | | | |
|---|---|---|---|
| 4,746,963 A | * | 5/1988 | Uchida et al. ............... 257/372 |
| 5,214,302 A | * | 5/1993 | Uchida et al. ............... 257/370 |
| 5,663,662 A | | 9/1997 | Kurosawa |
| 6,442,735 B1 | | 8/2002 | Joshi et al. |

* cited by examiner

*Primary Examiner*—Thuan Do
(74) *Attorney, Agent, or Firm*—Reed Smith LLP; Stanley P. Fisher, Esq.; Juan Carlos A. Marquez, Esq.

(57) ABSTRACT

The number of design processes for fabricating semiconductor devices can be reduced by parallel connection of a plurality of unit bipolar transistors Qu that are completely electrically isolated from each other in a semiconductor layer of an SOI substrate 1 to form a bipolar transistor having a large current capacity.

7 Claims, 23 Drawing Sheets

SEMICONDUCTOR DEVICE AND METHOD FOR FABRICATING THE SAME

This application is a Continuation application of U.S. application Ser. No. 10/092,594 filed on Mar. 8, 2002 now U.S. Pat. No. 6,662,344. Priority is claimed based upon U.S. application Ser. No. 10/092,594 filed on Mar. 8, 2002, which claims the priority date of Japanese application 2001-098015 filed on Mar. 30, 2001.

BACKGROUND OF THE INVENTION

The present invention relates to a semiconductor device and a method for fabricating the same, and more particular to technology that is effective when applied to bipolar transistor-based semiconductor devices of the insulating element isolation type.

One known type of semiconductor device includes a base substrate and an element-forming-semiconductor layer with an insulating layer disposed between them. Devices of this type include SOI (Silicon On Insulator) devices and devices in which the element-forming semiconductor layer is divided into a plurality of semiconductor islands by isolation trenches or trenches into which an insulating material is filled. An SOI semiconductor device has quite less parasitic capacitance than a pn-junction element isolation semiconductor device and has smaller leakage current, thereby making it possible to increase the processing speed and reduce power consumption, so this technology has been applied to BiCMOS and C-Bipolar semiconductor devices with digital circuits, analog circuits or a mixture of both types, configured with bipolar and CMOS (Complementary-MOS) transistors and complementary bipolar transistors, respectively. The SOI semiconductor device also requires various types of bipolar transistors with different current capacities for various types of application circuits including logic circuits, driver circuits, and output circuits.

The bipolar transistor-based SOI semiconductor device technology that has been studied by the inventors of the present invention provides a plurality of types of large-current bipolar transistors in different geometrical sizes, and arranges and connects these large-current bipolar transistors depending on current capacities (allowable currents) required, thereby configuring an entire semiconductor device.

SUMMARY OF THE INVENTION

The inventors of the present invention found that the technology described above, however, has the following problems.

The necessity of preparing various types of bipolar transistors increases the number of device parameters that must be defined, and accordingly makes the tuning of analog circuit characteristics very complicated, resulting in an increase in the number of fabrication processes and complexity of tasks for design of semiconductor devices.

More specifically, if various types of bipolar transistors having different allowable currents obtained by changing the geometrical dimensions, are formed, since the geometrical dimensions including the size of semiconductor islands surrounded by isolation-element isolation grooves, areas of emitter and collector junctions, and electrode connection area for emitter, base, and collector regions, or the impurity concentration distributions vary depending on the transistors, the device parameters differs depending on the transistors, which makes the design complicated. In addition, it is possible that electrical characteristics of transistor devices, such as amplification gains, base resistances, and noise factors, may depend on their geometrical dimensions.

The inventor of the present invention examined known examples of bipolar transistor-based semiconductor device technology. One of the examples, which has been disclosed in JP-A-102916/1999, configures the first stage of a multi-stage amplifier by parallel-connecting bipolar transistors of a structure with a plurality of single emitters that are separated from each other by field insulating films formed by the local oxidation of silicon (LOCOS) method and pn junctions.

It is accordingly an object of the present invention to provide technology that can reduce the number of design processes for semiconductor devices.

Another object of the present invention is to provide semiconductor devices with improved electrical characteristics of large-current transistors.

These and other objects and features of the present invention will become clear in the following detailed description, when read with reference to the attached drawings.

The main features of the invention disclosed herein can be summarized as follows.

The present invention configures a large current capacity bipolar transistor by parallel-connecting a plurality of unit bipolar transistors that are completely electrically isolated from each other in a semiconductor layer on an SOI substrate.

The present invention configures a transistor that yields a desired current capacity by connecting a plurality of unit bipolar transistors that are substantially the same in geometrical dimensions in parallel.

The present invention arranges a plurality of unit bipolar transistors in a matrix to form one bipolar transistor with a large current capacity.

The present invention configures a parallel-connection wiring in multi-layer wiring. For example, emitter, base, and collector contact regions are connected in parallel, by the first and second layer wiring.

The present invention configures a plurality of types of bipolar transistors that differ in the number of unit transistors parallel-connected therein, in the SOI substrate (chip) included in a semiconductor device, thereby enabling configuration of a plurality of bipolar transistors that differ in allowable current from each other. One practical configuration contains a logic circuit portion configured by using unit transistors with comparatively small allowable current (current consumption) and an analog output circuit portion configured by using a bipolar transistor made of many transistors connected in parallel, having a comparatively large allowable current. Although the geometrical dimensions of the unit transistors are not expressly limited, they can be determined with reference to the dimensions of transistors that are utilized most frequently to configure the semiconductor device, such as transistors in the logic circuitry. The dimensions of the unit transistors may be determined also with reference to dimensions that are limited by their minimum workable dimensions.

In addition, the present invention can determine the allowable current uniquely by changing the number of parallel-connected unit transistors of identical size. Therefore, the design of the transistors becomes simply a matter of specifying this number. Furthermore, a comparatively large-current transistor can be configured by wiring unit transistors of identical size together in parallel to obtain the necessary size, whereby degradation of characteristics of base resistance and other circuit parameters can be avoided. For an SOI semiconductor device in which transfer rates of heat radiated from the large-current transistors are particularly lowered, heat can be dissipated through wiring for the parallel connection.

The other features of the present invention will be understood from the following descriptions of the embodiments.

DETAILED DESCRIPTION OF THE PREFERRED EMBODIMENTS

Figure 1A:
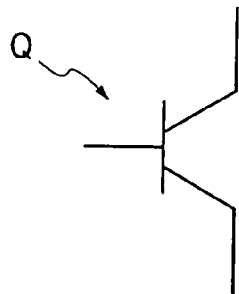
FIG. 1(a) indicates a symbol of a bipolar transistor disposed in a semiconductor device according to an embodiment of the present invention.

The meaning of terms used herein will be given before the invention is described in detail.

1. A silicon-on insulator (SOI) substrate refers to a semiconductor substrate having a semiconductor layer on an insulating layer, on which an integrated circuit is formed. This type of substrate has an insulating layer disposed between a base substrate and a semiconductor layer. Bipolar transistors formed in the semiconductor layer are isolated from other regions by isolation-element isolation grooves.

2. Transistors of identical size (identical transistors) refer to transistors identical in current-carrying capacity (allowable current), or more specifically to transistors with identical optimum current values. An optimum current value refers to the collector current value at which a transistor exhibits its most preferable current gain, noise factor, and other electrical characteristics. From a structural standpoint, unit transistors of identical size refer to those having semiconductor islands (transistor-forming regions) shaped in rectangular or another shape, substantially identical in either plane area, shape, or dimensions (length and width). The semiconductor island is formed on the semiconductor layer of an SOI substrate and surrounded by isolation-element isolation grooves, in which emitter, base, and collector regions are formed. Therefore, although not expressly limited, it is preferable to provide identical dimensions of the plane length and width of emitters and collector-junction areas among unit transistors, and also identical shape and dimensions (dimensions of length and width) of contact regions (electrode lead regions) for emitter, base, and collector regions required for their parallel interconnections among unit transistors. Furthermore, the present invention also allows use of a multi-emitter structure for unit transistors formed in a semiconductor island surrounded by element isolation grooves. In this case, it is also preferable to make the width and length dimensions of the emitters identical to each other. Identical depth of the emitter and collector junctions of the unit transistors is also preferable. From a standpoint of fabrication, the device regions and the emitter, base, and collector regions are made identical in size among a plurality of unit transistors, which enables easier fabrication of the photolithography masks required by each manufacturing steps.

3. Minimum unit size of a transistor to be connected in parallel refers to the smallest dimension determined in consideration of the characteristics of a given circuit used in a semiconductor device.

Although the following embodiments will be described separately and the descriptions will be divided into sections as necessary for convenience, unless indicated explicitly, the descriptions are not independent of each other, but provide examples of variations, details, or supplemental remarks of pertaining to partial or full description given in other sections.

In the following descriptions of the embodiments, if the number of elements (including counts, values, amount, ranges, and other elements) is mentioned, unless otherwise specified explicitly or obviously limited to a certain number in principle, the number is not limited to the mentioned number and may be larger and smaller than that number.

In addition, it is needless to say that the components mentioned in the following descriptions of the embodiments (including component steps) are not always necessary, unless so specified explicitly or obviously considered to be indispensable.

Similarly, the shapes and positional relationships of the components and other elements mentioned in the descriptions of the embodiments are assumed to include shapes and alignments analogous or similar thereto, unless otherwise specified explicitly or obviously such other shapes and positional relationships would be incorrect in principle. This rule applies also to the values and ranges mentioned above.

Through the attached drawings for illustrating the embodiments of the present invention, like reference symbols indicate like functions, so repeated descriptions will be omitted.

Some of the attached drawings referenced in the descriptions of the embodiments of the present invention are hatched for legibility of the plan views.

In the detailed description of the embodiments of the present invention, the term bipolar transistor is abbreviated as 'transistor'.

The embodiments of the present invention will now be described with reference to the attached drawings.

First Embodiment

FIG. 1(a) shows the symbol of a transistor Q included in a semiconductor device according to an embodiment of the present invention. The transistor Q is a large-current transistor capable of carrying relatively large current, and the conductivity type of the common region may be either npn or pnp.

Figure 1B:
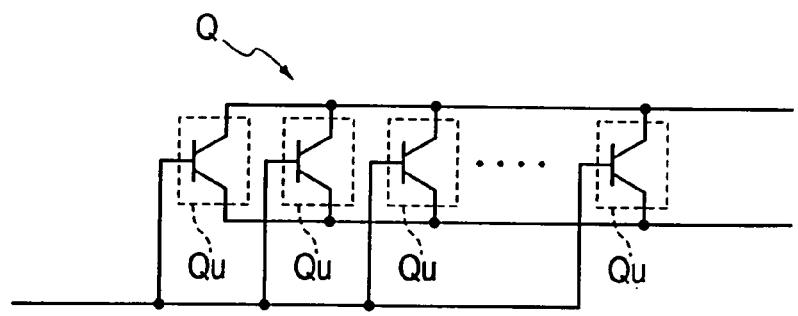
FIG. 1(b) is a circuit diagram of the bipolar transistor shown in FIG. 1(a)

FIG. 1(b) shows a circuit configuration of a transistor Q shown in FIG. 1(a). The transistor Q is configured by connecting a plurality of unit transistors Qu of identical size in parallel. More specifically, the bases, emitters, and collectors of the plurality of unit transistor Qu are electrically interconnected by respective wiring.

Figure 1C:
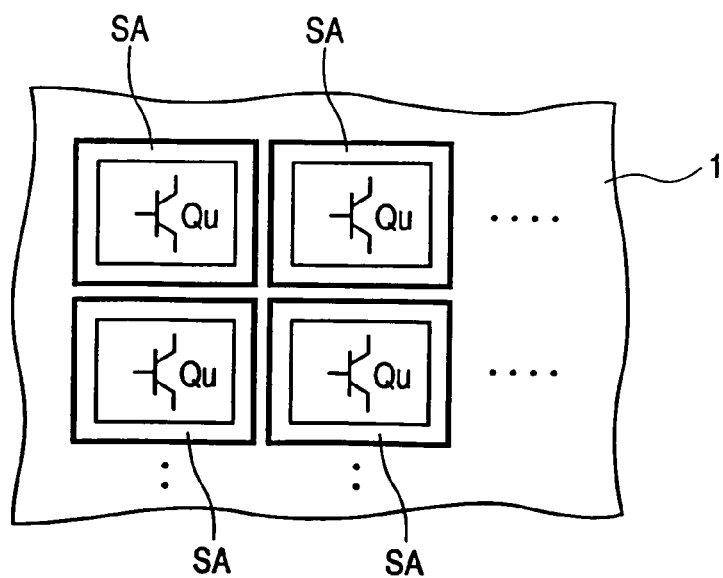
FIG. 1(c) is a plan view of part of the device structure of the bipolar transistor of FIG. 1(a)

FIG. 1(c) is a schematic diagram showing the device structure of the transistor Q shown in FIGS. 1(a) and (b). In this embodiment, the unit transistors Qu included in transistor Q are disposed in a state such that they are completely electrically isolated from each other in a semiconductor layer of an SOI substrate 1. More specifically, on the main surface of the SOI substrate, for example, a plurality of semiconductor islands (SA) flatly rectangular in shape are disposed adjacent to each other in a regularly spaced matrix. The plurality of semiconductor islands SA are completely electrically isolated by deep isolation trenches that will be described later and the insulating-layer of the SOI substrate. Unit bipolar transistors Qu are formed in each of the plurality of semiconductor islands SA.

Figure 2A:
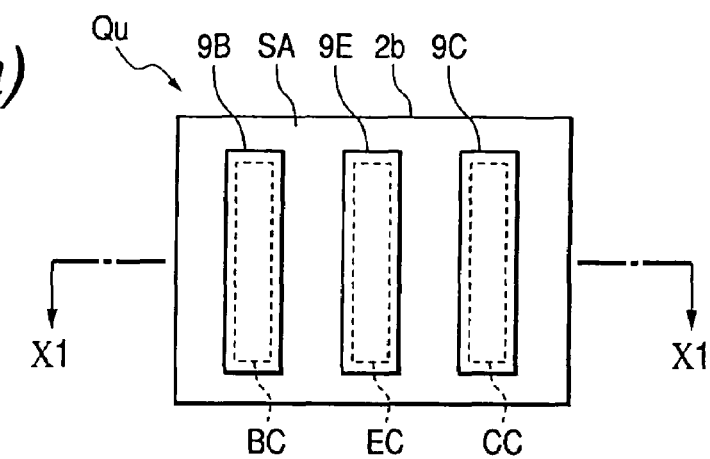
FIG. 2(a) is a plan view showing a unit bipolar transistor disposed in the bipolar transistor of FIG. 1(a)
Figure 2B:
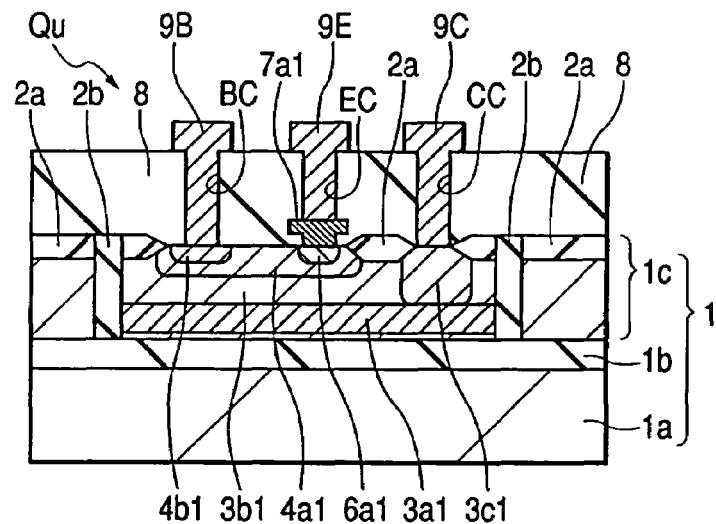
FIG. 2(b) is a sectional view through line X1—X1 of the unit bipolar transistor of FIG. 2(a), assuming that it is a pnp transistor.
Figure 2C:
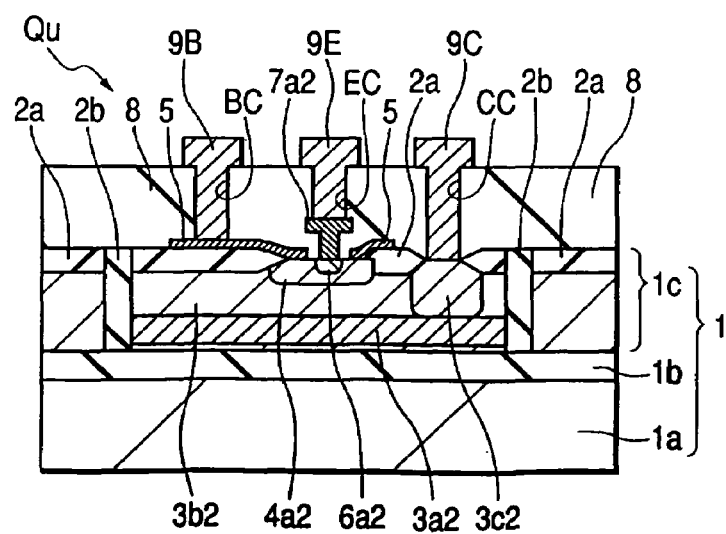
FIG. 2(c) is a sectional view through line X1—X1 of the unit bipolar transistor FIG. 2(a), assuming that it is an npn transistor.

FIG. 2 shows an example of the device structure of unit transistor Qu shown in FIG. 1. FIG. 2(a) is a plan view of unit transistor Qu; FIG. 2(b) is a sectional view through line X1—X1, assuming that unit transistor Qu is a pnp transistor; and FIG. 2(c) is a sectional view through line X1—X1, assuming that unit transistor Qu is an npn transistor. Although each drawing depicts the structure of a vertical transistor, a lateral transistor may be used.

The SOI substrate includes a base substrate 1a, an insulating layer 1b, and a semiconductor layer 1c laminated in this order. The base substrate 1a includes n-type single-crystal silicon (Si) or another applicable material, and provides mechanical strength of the SOI substrate 1. The insulating layer 1b is made of silicon oxide (SiO.sub.x) or another applicable material, with a thickness is on the order of, for example, 0.2 to 0.5 μm. The semiconductor layer 1c is made of single-crystal silicon or another applicable material, on which integrated circuit elements are formed. The SOI substrate 1 is formed by a bonding method, for example, and more specifically, in the following steps: two semiconductor wafers (referred to just as wafers below) made of single-crystal silicon or another applicable material are bonded with the insulating layer 1b between them; the unbonded surface of one of the wafers are abraded and polished; a buried collector layer (buried collector regions 3a1 and 3a2 described later) is formed in the abraded and polished unbonded surface of the wafer; and given conductive single-crystal silicon or another applicable material is grown epitaxially. Therefore, the single-crystal silicon layer of the semiconductor layer 1c includes a wafer part and epitaxial layer part.

The isolation region on the main surface (integrated circuit element-forming surface) of the semiconductor layer 1c includes a shallow groove isolation part 2a and deep groove isolation part (element isolation trench) 2b. The shallow groove isolation part 2a are formed by the local-oxidization-of-silicon (LOCOS) method or another applicable method. The planar range of the active region of the integrated circuit elements is defined by the shallow groove isolation part 2a. The bottom of the shallow groove isolation part 2a does not reach the insulating layer 1b, part of the semiconductor layer 1c is left intact below the groove. The shallow groove isolation part 2a can be formed not only by the LOCOS method but also by the shallow groove isolation (SGI) method. The shallow groove isolation part 2a is formed by filling an insulating film made of silicon oxide or another applicable material into a shallow groove excavated from the main surface of the semiconductor layer 1c to the depth that does not reach the insulating layer 1b. On the other hand, the deep groove isolation part (trench isolation) 2b is formed by filling an insulating film made of silicon oxide or another applicable material into a deep groove that has been excavated from the upper surface of the shallow groove isolation 2a through the shallow groove and the semiconductor layer 1c down to the insulating layer 1b. Unit transistors Qu are formed in a region surrounded by the deep groove isolation part 2a and the insulating layer 1b. Therefore, unit transistors Qu are completely electrically isolated from each other in the semiconductor layer 1c. The semiconductor islands SA surrounded by the deep groove isolation part 2b of the unit transistors Qu are identical in planar size among transistors.

Referring to FIGS. 2(b) and (c), each of the semiconductor layers 1c (semiconductor islands SA) includes the buried collector regions 3a1 and 3a2. The buried collector region 3a1 is a P+ type region created by the insulation of boron (B) or another applicable material; the buried collector region contains antimony or another applicable material, being made n+ type. Collector regions 3b1 and 3b2 and collector lead regions 3c1 and 3c2 are formed in layers above the buried collector regions 3a1 and 3a2, respectively. The collector region 3b1 contains boron, for example, being made p-type; the collector 3b2 is an n-type region containing phosphorus (P), arsenic (As), or another applicable material. The collector lead region 3c2 is a P+ type region containing boron or another applicable material; the collector lead region 3c2 is an n+-type region containing phosphorus, arsenic, or another applicable material. The collector regions 3b1 and 3b2 and the collector lead regions 3c1 and 3c2 are isolated from each other by the shallow groove isolation part 2a provided between them, but electrically interconnected through the buried collector regions 3a1 and 3a2 with low resistance.

Base regions 4a1 and 4a2 are formed above the collector regions 3b1 and 3b2, respectively. The base region 4a1 shown in FIG. 2(b) is an n-type region containing phosphorus, arsenic, or another applicable material. In the base region 4a1, a base lead region 4b1 is formed. The base lead region 4b1 contains phosphorus, arsenic, or another applicable material, being made n+ type. On the other hand, the base region 4a2 shown in FIG. 2(c) is a p-type region containing boron, or another applicable material. The base region 4a2 is electrically connected to a base lead electrode 5 made of p-type polycrystalline silicon or another applicable material. The other terminal side of the base lead electrode 5 is formed in a pattern extending onto the shallow groove isolation part 2a.

In the upper part of the base region 4a1 and 4a2, emitter regions 6a1 and 6a2 are formed, respectively. The emitter region 6a1 shown in FIG. 2(a) is a p+ type region containing boron or another applicable material. The emitter region 6a1 is electrically connected to an emitter lead electrode 7a1 made of p-type polycrystalline silicon or another applicable material. On the other hand, the emitter region 6a2 is an n+-type region containing phosphorus, arsenic, or another applicable material. The emitter region 6a2 is electrically connected to an emitter lead electrode 7a2 made of n-type polycrystalline silicon. The emitter lead electrode 7a2 and the base lead electrode 5 are isolated from each other.

Areas occupied by unit transistors Qu to be connected in parallel are identical in size, and dimensions of widths and lengths of the emitters of the unit transistors Qu are also identical across one semiconductor device. The emitter width value is generally the minimum dimension with which preferable transistor characteristics are obtainable in a given product or technology generation. Emitter widths can be made smaller than the minimum feature size of the photolithography technology. It is also possible to define a small-current transistor having the smallest emitter width in a semiconductor device as a unit transistor, and a transistor having emitter width twice or larger than the smallest emitter width as the large-current transistor. The emitter length (the length of a longitudinal line intersecting the emitter width) depends on the value of collector current required by the unit transistor Qu and other parameters.

An insulating film 2 made of silicon oxide or another applicable material is deposited on the semiconductor layer 1c, and above the shallow groove isolation part 2a and deep groove isolation part 2b. On the insulating film 8, a base electrode 9B, an emitter electrode 9E, and a collector electrode 9C are formed. The base electrode 9B, emitter electrode 9E, and collector electrode 9C are made of aluminum, an aluminum alloy, or another applicable metal. Referring to FIG. 2(b), the base electrode 9B is electrically connected to the base lead region 4b1 through a contact hole BC. The emitter electrode 9E is electrically connected to the emitter lead region 7a1 through a contact hole EC. The collector electrode 9C is electrically connected to the collector lead region 3c1 through a contact hole CC. On the other hand, referring to FIG. 2(c), the base electrode 9B is electrically connected to the base lead electrode 5 through the contact hole BC. The emitter electrode 9E is electrically connected to the emitter lead electrode 7a2 through the contact hole EC. The collector electrode 9C is electrically connected to the collector lead region 3c2 through the contact hole CC. It is preferable to make the sizes of the contact holes BC, EC, and CC identical to each other among the transistors connected in parallel.

Figure 3:
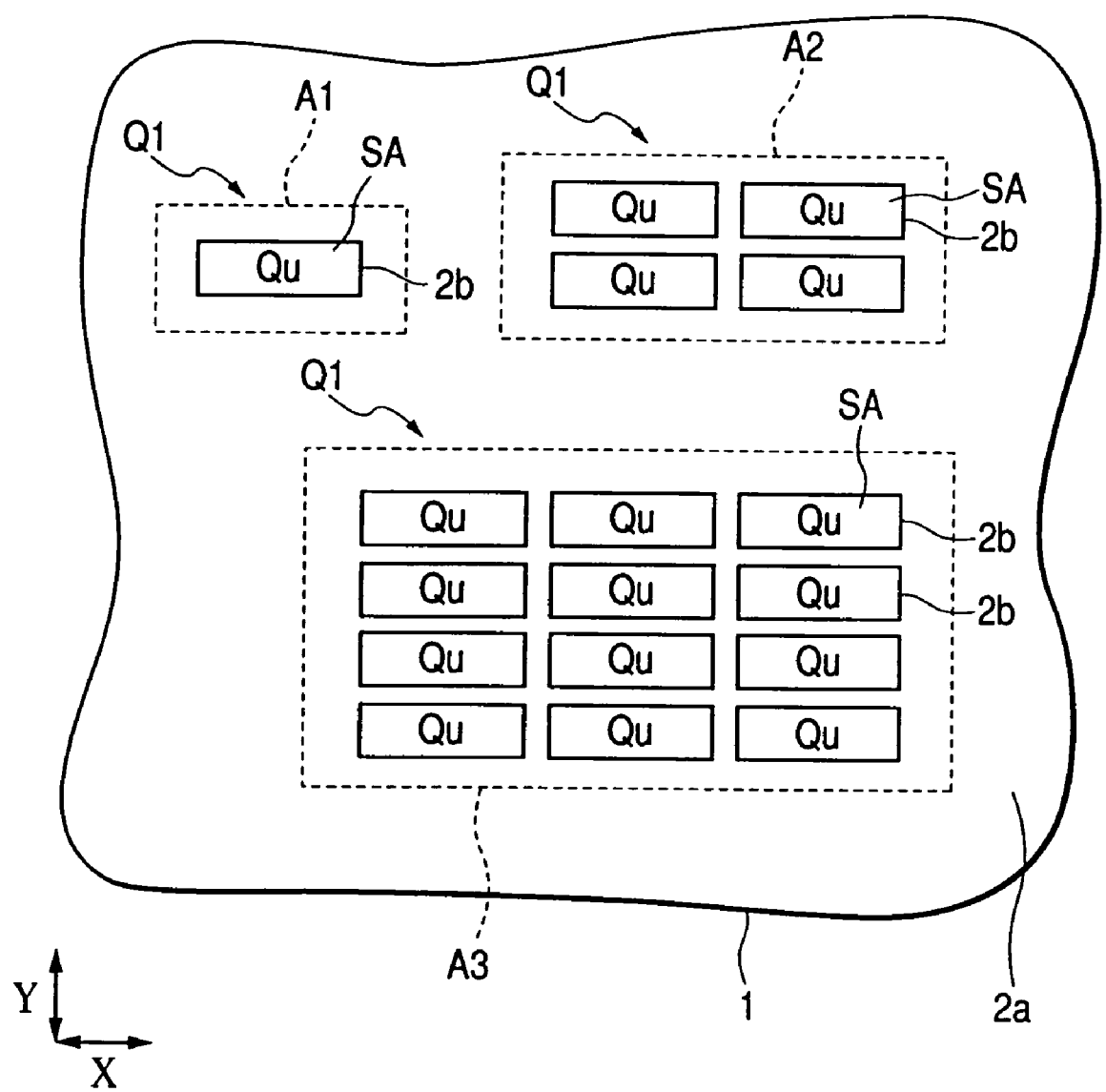
FIG. 3 is a plan view of the main part of an SOI substrate showing an exemplary layout of semiconductor islands in the semiconductor device of FIG. 1.

FIG. 3 shows an exemplary arrangement of semiconductor islands SA on the main surface of the same SOI substrate 1. Region A1 indicates an exemplary region in which one semiconductor island SA with one unit transistor Qu is used to form a transistor Q with desired electrical characteristics. In this case, the region is integrated into the semiconductor device by wiring which will be described later. Region A2 indicates an exemplary region in which four semiconductor islands SA of identical size having one respective unit transistor Qu each are used; and region A3 indicates an exemplary region in which a dozen semiconductor islands SA of identical size having one respective unit transistor Qu therein are used. In the regions A2 and A3, a plurality of semiconductor islands SA are disposed with regular spacing in a matrix in the horizontal and vertical directions (X and Y directions) in FIG. 3. In this case, in each of the regions A2 and A3, the unit transistors Qu are interconnected by wiring which will be described later to form a transistor Q with desired electrical characteristics, emitter regions being connected to emitter regions, base regions to base regions, and collector regions to collector regions.

Figure 4:
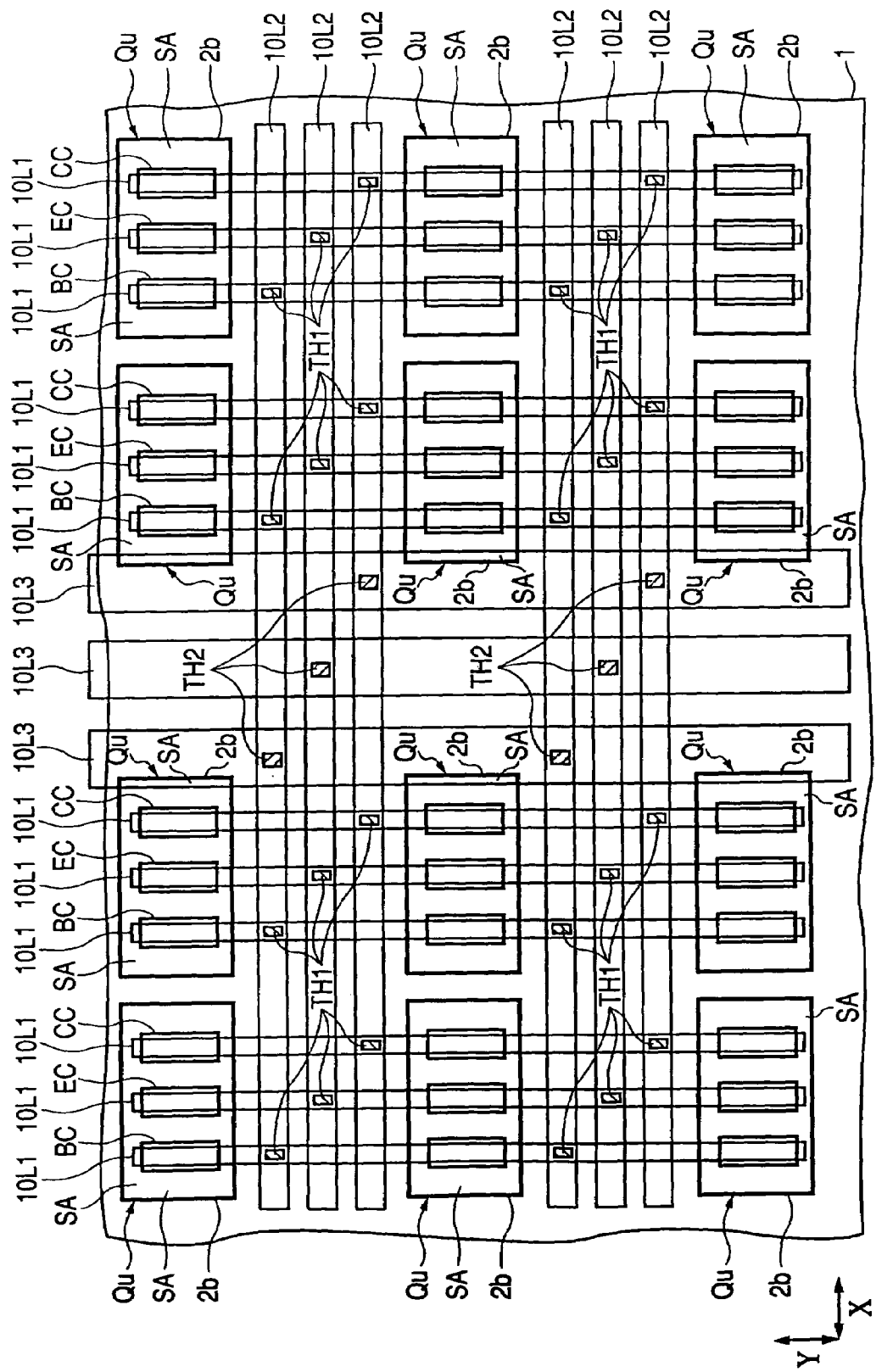
FIG. 4 is a plan view of a main part of an SOI substrate showing an example of the wiring connections of a plurality of unit bipolar transistors in the semiconductor device mentioned with reference to FIG. 1.

FIG. 4 shows an exemplary wiring connection of the plurality of unit transistors Qu described with reference to FIGS. 1 to 3. In this example, four rows of three columns, or twelve semiconductor islands SA (unit transistors Qu) in total, are disposed adjacent to each other in a regular arrangement on the SOI substrate 1. Wiring regions in the spaces between adjacent rows and the space between the central columns, where the spacing between adjacent semiconductor islands SA is enlarged. More specifically, this drawing shows an example in which wiring regions are disposed on the shallow groove isolation part 2a.

The base regions, emitter regions, and collector regions in the plurality of column-direction (Y-direction) unit transistors Qu shown in FIG. 4 are electrically interconnected through band-shaped column-direction (Y-direction) first layer wiring 10L1. The first layer wiring 10L1 cannot be provided with sufficient line width in general, how ver, restricting the maximum current flow allowed through a unit transistor Qu, thus limiting the number of unit transistors that can be disposed in the row direction of the matrix. In order to circumvent this limitation, it is preferable to use additional second or higher wiring layers that enable wiring with wider line widths than in the first layer wiring 10L1. FIG. 4 shows an example in which a second layer wiring 10L2 is disposed in wiring regions between adjacent rows and a third layer wiring 10L3 is disposed in the central column wiring region.

The second layer wiring 10L2 extends in a row direction (X direction), intersecting the column-direction first layer wiring 10L1 at right angles, and is electrically connected to the first layer wiring 10L1 at their points of intersection via through holes TH1. More specifically, the second layer wiring 10L2 of the uppermost row in the wiring region between adjacent rows is connected to the first layer wiring 10L1 via a through hole TH1, and is also electrically connected to the base region of a unit transistor Qu through contact hole BC. The second layer wiring of the intermediate row in the wiring region between adjacent rows is connected to the first layer wiring 10L1 through a through hole TH1, and is also electrically connected to the emitter region of the unit transistor Qu through contact hole EC. The second layer wiring of the bottom row in the wiring region between adjacent rows is connected to the first layer wiring 10L1 via a through hole TH1, and is also electrically connected to the collector lead region of the unit transistor Qu via contact hole CC. It is preferable that the through hole TH1 is disposed at the shortest distance from the unit transistor Qu. This can improve the balance of efficiency in supplying current to each unit transistor Qu.

A third layer wiring 10L3 is provided on a layer above the second layer wiring 10L2 and made wider than the second layer wiring 10L2. The third layer wiring 10L3 extends in the column direction (Y direction), intersecting the row-direction second layer wiring 10L2 at right angles, and is electrically connected to the second layer wiring 10L2 at their points of intersection via through holes TH2. More specifically, the third layer wiring 10L3 of the leftmost column in the central column wiring region is connected to the second layer wiring 10L2 of the uppermost row in the wiring region between adjacent rows via a through hole TH2. The third layer wiring of the intermediate column in the central column wiring region is connected to the second layer wiring 10L2 of the intermediate row in the wiring region between adjacent rows via a through hole TH2. The third layer wiring 10L3 of the rightmost column in the central column wiring region is connected to the second layer wiring 10L2 of the bottom row in the wiring region between adjacent rows via a through hole TH2.

The third layer wiring 10L3 is provided because, if it were not provided, the number of unit transistors Qu that could be disposed in the row direction of the matrix would be limited by the current feeding capability of the second layer wiring 10L2. More row-direction unit transistors Qu can be added if the width or sectional area of the third layer wiring 10L3 is widened. The first wiring 10L1, second layer wiring 10L2, and third layer wiring 10L3 are made of aluminum, an aluminum alloy, or another applicable metal. The first wiring 10L1, second layer wiring 10L2, and third layer wiring 10L3 are interconnection wiring, each including base wiring or base common wiring that is connected to the base region of the unit transistor Qu, emitter wiring or emitter common wiring that is connected to the emitter region of the unit transistor Qu, and collector wiring or collector common wiring that is connected to the collector lead region thereof.

Figure 5:
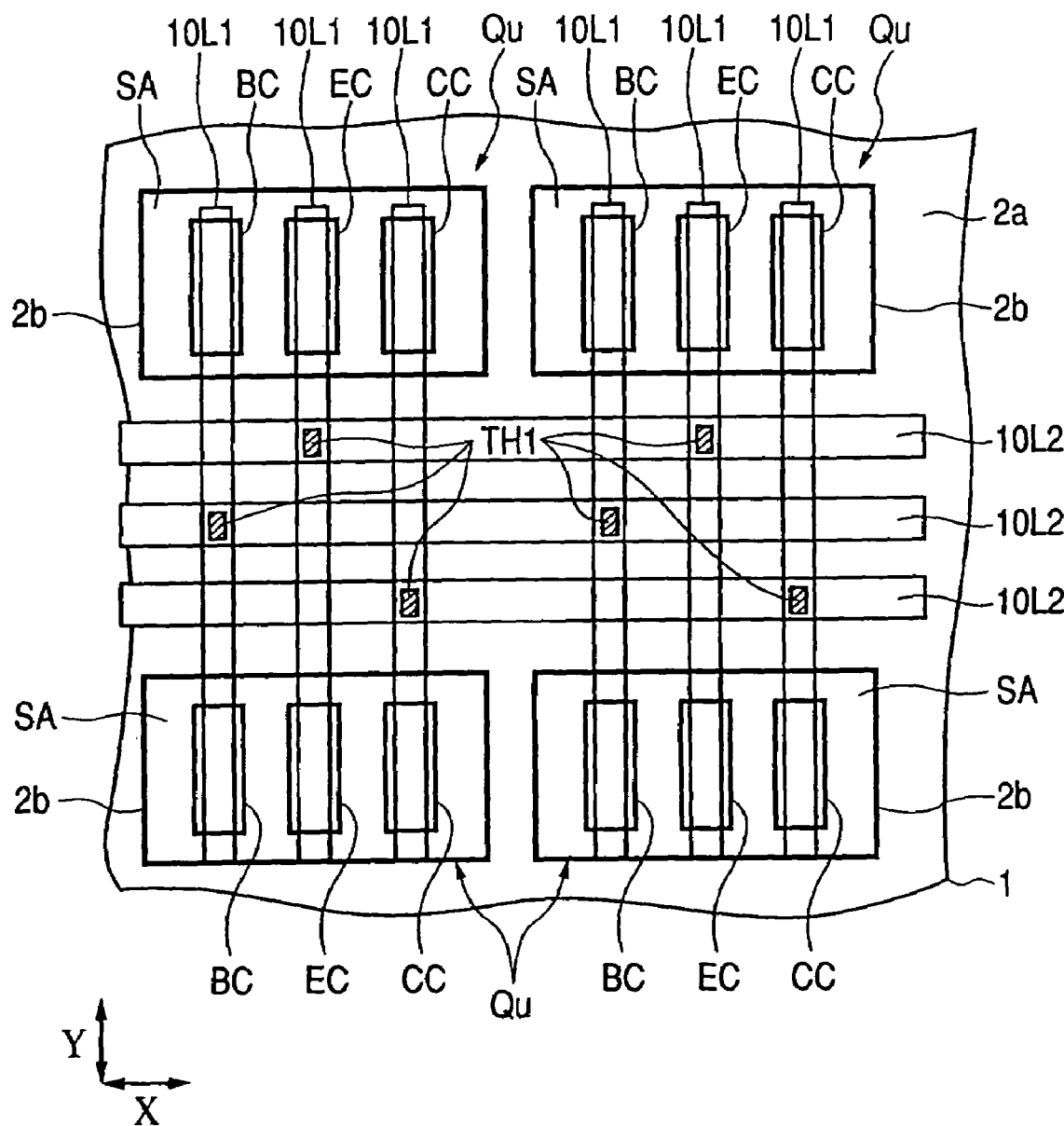
FIG. 5 is an enlarged plan view of a main part of an SOI substrate showing an exemplary variation of the arrangement of through holes for interconnecting the first and second layer wiring shown in FIG. 4.

FIG. 5 shows a variation of the arrangement of the through hole. TH1. FIG. 5 is an enlarged view showing only the main part of the view shown FIG. 4. The first layer wiring 10L1 for the bases is electrically connected to the second layer wiring 10L2 of the intermediate row in the wiring region between adjacent rows through the through hole TH1. The first layer wiring 10L1 for the emitter is electrically connected with the second layer wiring 10L2 of the uppermost row in the wiring region between adjacent rows through the through hole TH1. The first layer wiring 10L1 for the collector is electrically connected with the second layer wiring 10L2 of the bottom row in the wiring region between adjacent rows through the through hole TH1.

The other structural features are the same as in FIG. 4. This enables changes in positions of base, emitter, and collector of the Y-direction third layer wiring.

Figure 6:
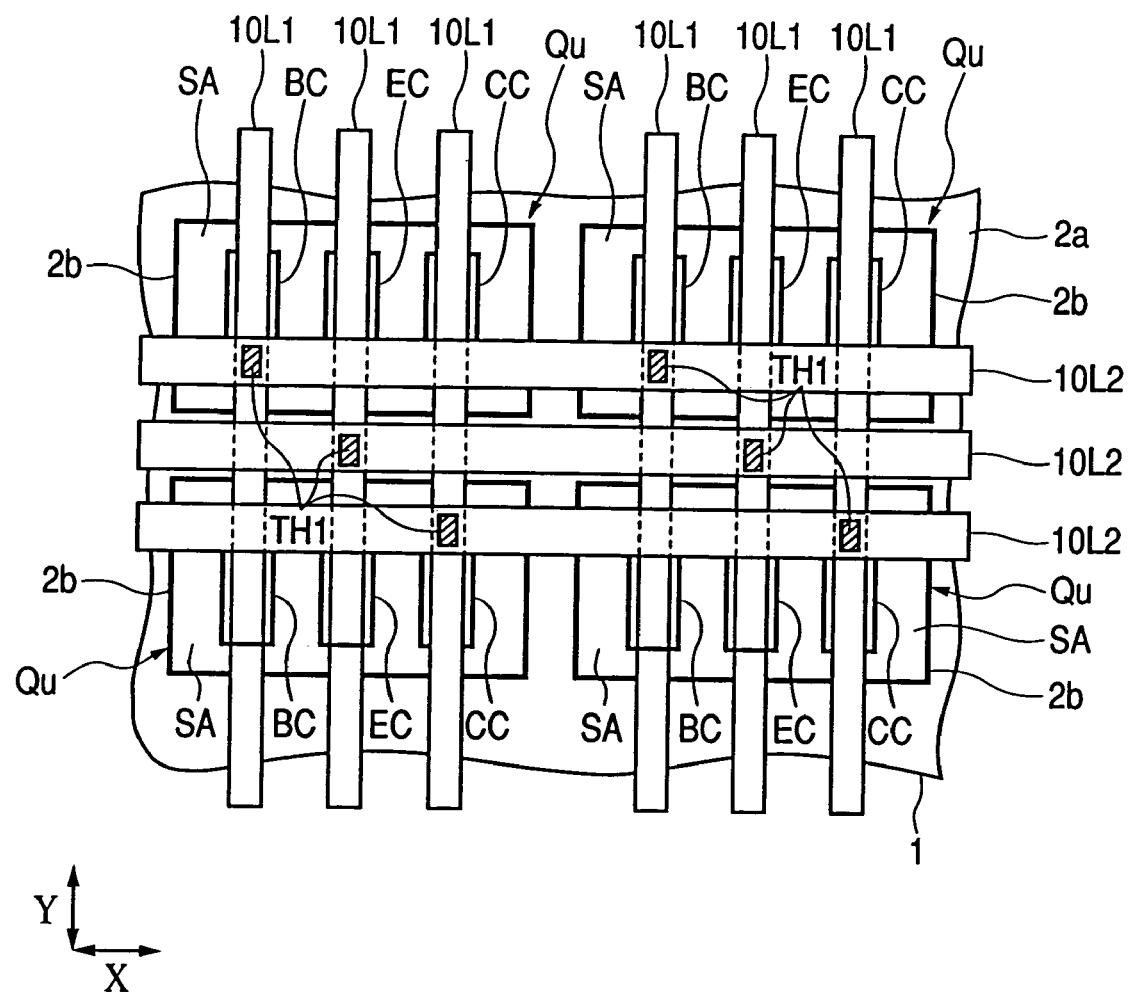
FIG. 6 is an enlarged plan view of a main part of an SOI substrate showing another exemplary variation of the arrangement of through holes for interconnecting the first and second layer wiring shown in FIG. 4.
Figure 7:
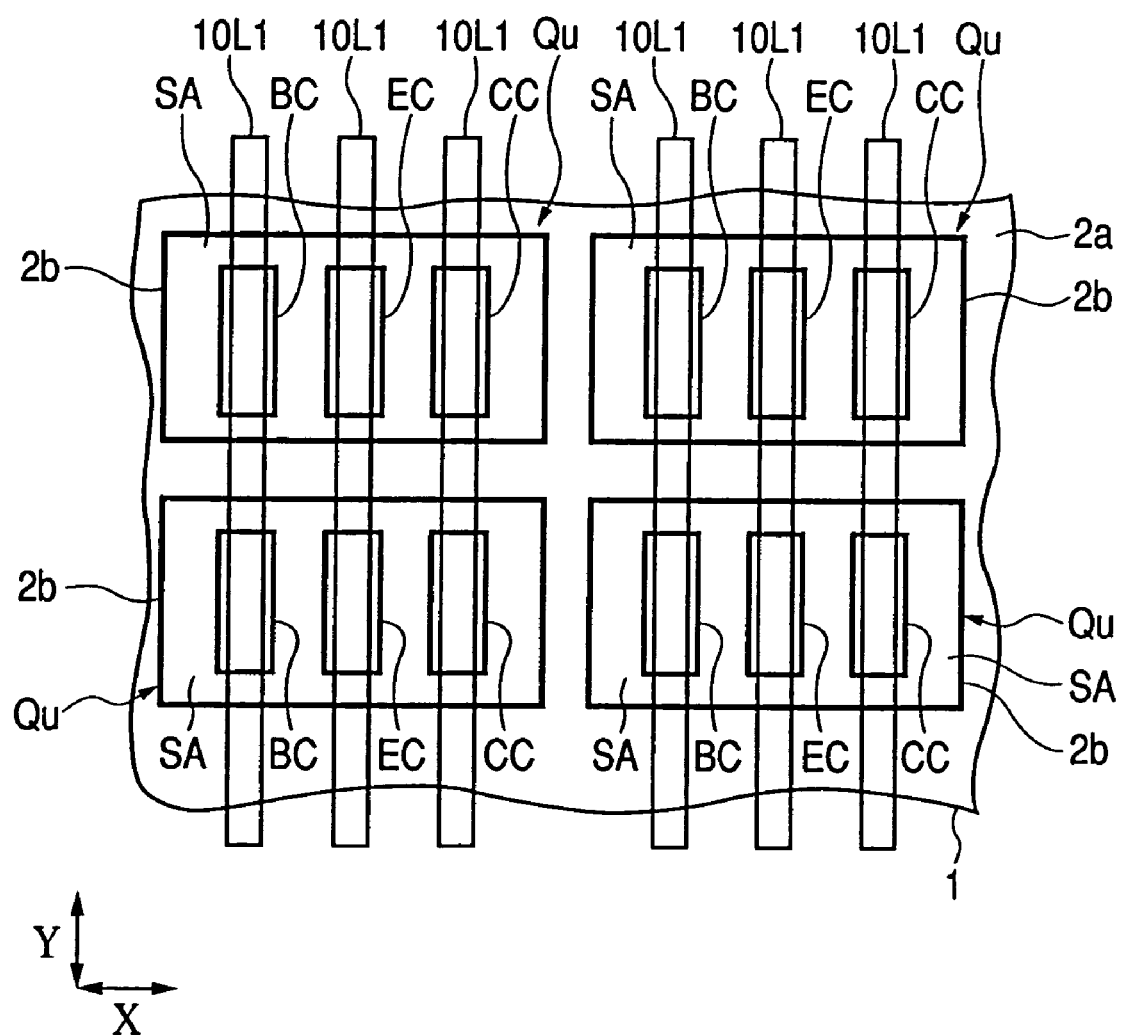
FIG. 7 is an enlarged plan view of the main part of an SOI substrate in which the second layer wiring has been removed from the wiring layers shown in FIG. 6.

FIGS. 6 and 7 shows another variation of the arrangement of the through holes TH1. FIG. 6 is a plan view of the main part of an SOI substrate, and FIG. 7 shows a view without the second layer wiring 10L2 shown in FIG. 6. In this case, it is assumed that the through holes TH1 associated with the bases and collectors can be disposed on the semiconductor island SA (in the region of the semiconductor island SA) by planarizing the insulating film underlying the first layer wiring 10L1 and second layer wiring 10L2 by chemical-mechanical-polish (CMP) method or another applicable method. Needless to say, the through holes, TH1 associated with bases and collectors may be disposed together with the through holes TH1 associated with emitters in the semiconductor island SA. The other structural features are the same as in FIG. 4. Since this structure eliminates the necessity for wiring regions, the widths of the spaces between adjacent semiconductor islands (unit transistors Qu) can be made smaller correspondingly smaller than shown in FIG. 4, resulting in improved integration density of circuit elements. Although FIGS. 4 to 7 shows the first layer wiring 10L1 having widths narrower than the widths of the contact holes BC, EC, and CC, the width of the first layer wiring 10L1 is actually wider than the widths of the contact holes BC, EC, and CC.

The following effects can be obtained by configuring a large-current transistor with unit transistors Qu completely isolated from each other as described above.

First, the number of steps in the design of a semiconductor device and the time required can be reduced. Conventional technology that the present inventors have examined includes technology that configures a large-current transistor with one transistor. This technology needs to provide a different type of transistor for each current requirement (required current capacity or required characteristic) and accordingly requires many types of transistors, thereby increasing the number of device parameters for each type of transistor. Therefore, tuning of characteristics in analog circuits also becomes very complicated. In contrast, this embodiment designs a large-current transistor with completely isolated unit transistors Qu and enables almost every type of large-current transistor to be designed with only one or two types of unit transistors Qu, thereby eliminating the need for preparing many device parameters. According to this embodiment, the characteristics of analog circuits can be tuned only by changing the number of unit transistors Qu to be connected in parallel. Therefore, the flexibility of designing semiconductor devices can be improved, and accordingly the number of design processes and tasks can be reduced substantially. The design time of semiconductor devices can also be reduced. The design cost can also be reduced. Furthermore, from the standpoint of fabrication, since the number of elements the characteristics of which must be controlled can be reduced, this embodiment provides the effects of reducing the number of quality control (QC) processes and enhancing the yield.

Second, this embodiment can improve the performance of semiconductor devices. In the technology that the present inventors have examined, to configure a large-current transistor with one transistor, it is necessary to increase the collector-base junction areas and emitter-base junction areas to obtain large current capacities, resulting in an inevitable increase in resistive components such as parasitic capacitance and parasitic resistance; this embodiment configures a large-current transistor by using unit transistors Qu that are completely isolated from each other as described above and have very small parasitic resistance and parasitic capacitance per transistor, making it possible to reduce the parasitic resistance and parasitic capacitance. Measurement results obtained by the inventors make it clear that this embodiment can reduce the capacitance between a transistor and the base substrate (collector capacitance or collector output capacitance) to half or one third the capacitance in the conventional technology that has been examined by the inventors. Therefore, according to this embodiment, noise generation in large-current transistors can be suppressed and the operating speeds thereof can be improved. That is, this embodiment can provide large-current transistors with higher performance (smaller parasitic capacitances and smaller parasitic resistances) and larger allowable current capacities.

In addition, since this embodiment forms a large-current transistor by using high performance unit transistors Qu with smaller emitter widths, it can improve the performance (such as current amplification factors and cut-off frequency characteristics) of large-current transistors. It is known that a transistor with a relatively small emitter width has better electrical characteristics than a transistor with a relatively large emitter width. This will now be described in detail by taking a result obtained from a study performed by the inventors as an example. For a comparison test, as one example, a large-current transistor with emitter dimensions (emitter width×emitter length×the number) of 2.25 µm×14 µm×10, total area of 40 µm×20 mµ=800 µm$^2$, and required collector current (Ic) of 50 mA, was prepared. The cut-off frequency (fT) of the transistor was 14 GHz, and the base resistance (rbb) was 7 Ω. As a small-current transistor (a unit transistor), as one example, a transistor with emitter dimensions of 0.2 µm×4 µm, total area of 3.3 µm×5.4 mµ=17.8 µm$^2$, and required collector current (Ic) of 1 mA was prepared. The small-current transistor was formed in the SOI substrate and was completely isolated from other transistors. The cut-off frequency (fT) of the small-current transistor was 33 GHz, and the base resistance (rbb) was 100 Ω. The large-current transistor mentioned above required 50-mA collector current, so an equivalent large-current transistor could be formed by connecting fifty of the above small-current transistors in parallel. The large-current transistor formed in this way had a cut-off frequency (fT) of 30 GHz, base resistance (rbb) of 3 Ω, and collector current (Ic) of 50 mA. Therefore, it is obvious that, for the same collector current of 50 mA, connecting small-current transistors in parallel can improve the cut-off frequency remarkably and reduce the base resistance substantially as compared with the case with one equivalent large-current transistor. In addition, the total required area was 3.5 µm×6 µm×50=1050 µm$^2$, so no substantial increase in area was necessary.

Third, this embodiment provides unit transistors Qu in an SOI substrate 1 and isolates them completely from each other, so it can reduce the space between adjacent unit transistors Qu, making it possible to form a large-current-transistor without substantial increase in area. If both large-current and small-current transistors are formed in a general semiconductor substrate with a structure other than an SOI structure, since the small-current transistors must be disposed with much greater spacing between them, there is no merit in forming a large-current transistor with small-current transistors; it is better to form one equivalent transistor of large current capacity. Therefore, a semiconductor substrate with a general structure would never lead to the concept of forming a large-current transistor from small-current transistors.

Fourth, this embodiment can improve thermal transfer efficiency by spreading out the heat-generating portions of the unit transistors and dissipating heat through common wiring, thereby making the thermal design easier. More specifically, higher power losses can be allowed.

Next, an example of a specific application of a semiconductor device according to this embodiment will be described.

In the example, the semiconductor device according to this embodiment is an analog-digital mixed-signal integrated circuit for communications use or industrial use, having bipolar-complementary metal oxide semiconductor (BiCMOS) ICs or complementary bipolar (C-Bip) ICs, for example. Although this embodiment provides benefits when it is applied to semiconductor devices employing only digital circuits, it is especially effective when applied to semiconductor devices with analog circuits in which advanced tuning of the characteristics is required.

Figure 8:
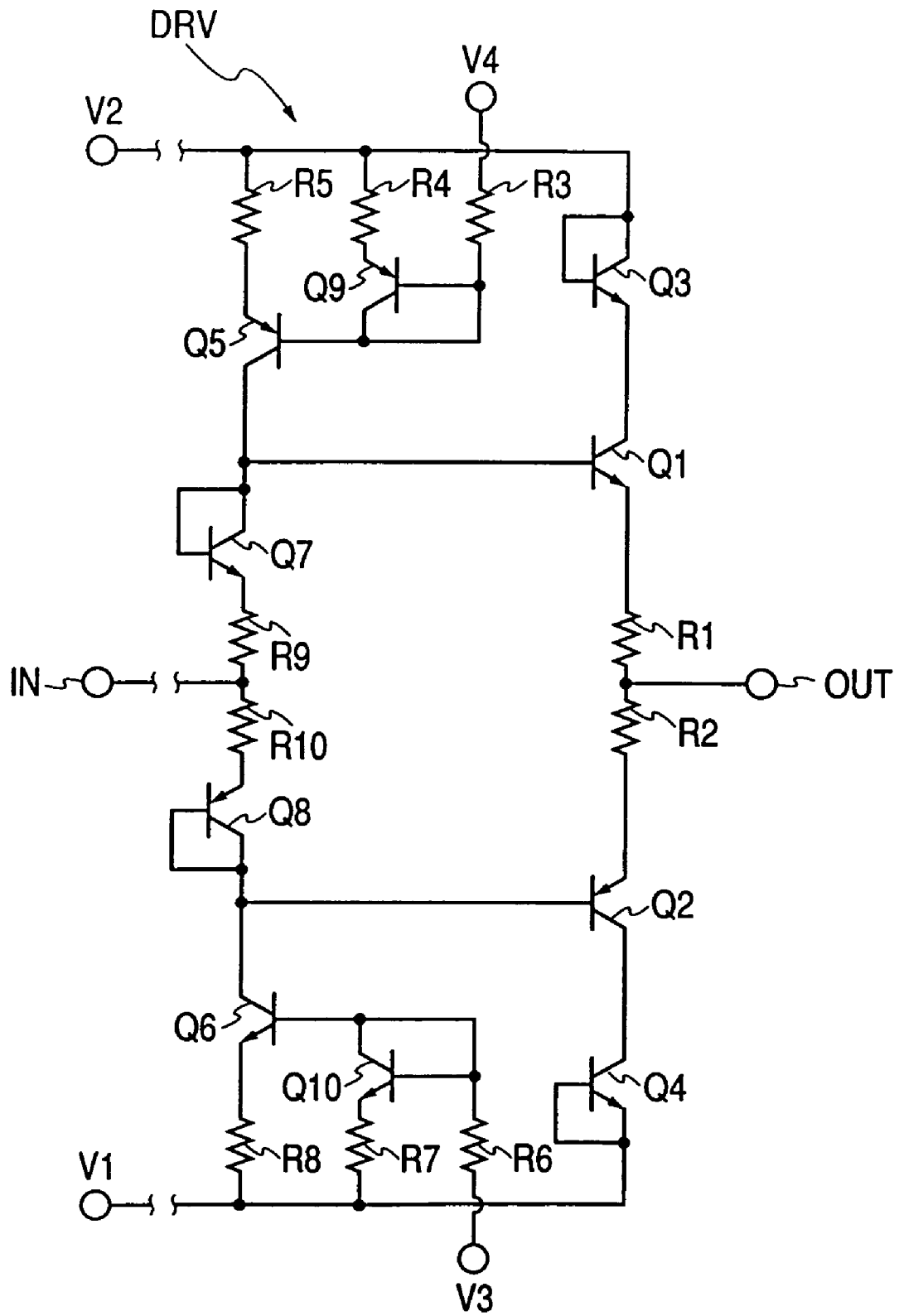
FIG. 8 is a diagram showing part of a circuit disposed in the semiconductor device according to an embodiment of the present invention.

FIG. 8 is a circuit diagram showing an output circuit included in this type of semiconductor device. The output circuit is a driver circuit DRV that performs B-class push-pull amplification. Performing B-class push-pull operation makes it possible to obtain four times the output obtainable through a one-transistor driver circuit, enabling noiseless and distortion-free amplification. The output circuit shown in this drawing can amplify a signal input at an input terminal IN with an amplitude on the order of 1 mA to a signal with 10-mA-order amplitude and output the amplified signal to an output terminal OUT. The driver circuit DRV has transistors Q1 to Q10 (corresponding to large-current transistors) and resistors R1 to R10, and is electrically connected between a reference potential power source V1 and a high potential power source V2. Source voltage V1 is −5 V, and source voltage V2 is +5 V. Bias adjusting voltage V3 is −1 V, and the voltage V4 is +1 V.

In the driver circuit DRV, transistors Q1, Q3, Q4, Q6, Q7, and Q10 are npn transistors, and transistors Q2, Q5, Q8, and Q9 are pnp transistors. Transistors Q1 and Q2 perform the push-pull operation. Transistors Q3, Q4, Q7, and Q8 are interconnected with diodes. The collector current (required current capacity or required characteristic) required by transistors Q1 to Q4 is 24 mA. The collector current required by transistors Q5 to Q8 is 8 mA. The collector current required by transistors Q9 and Q10 is 2 mA.

Figure 9:
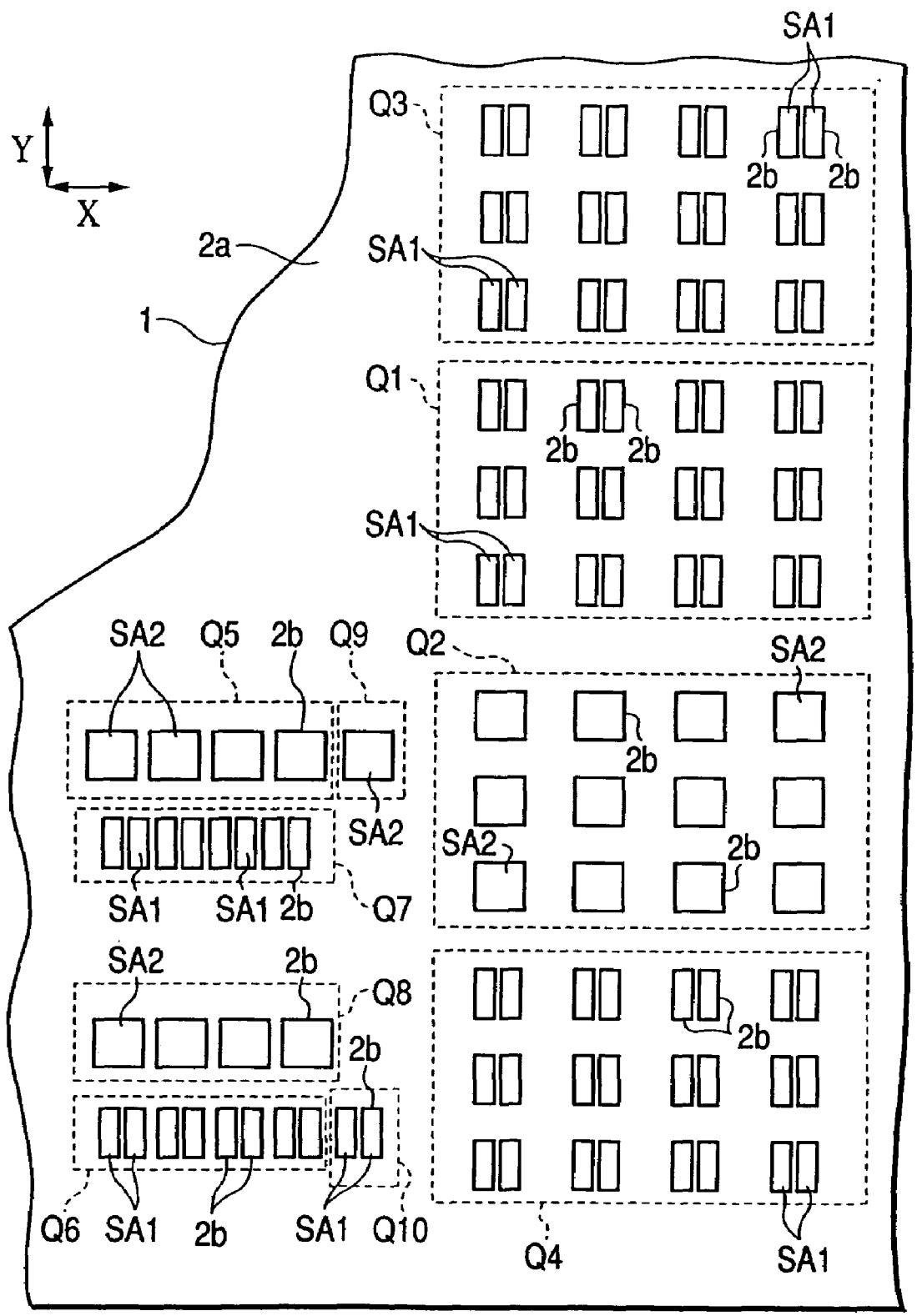
FIG. 9 is a plan view of the main part of an SOI substrate showing the arrangement of semiconductor islands in the formation region of the circuit shown in FIG. 8.

This embodiment configures each of transistors Q1 to Q10 from unit transistors Qu. FIG. 9 is a plan view of the main part of the SOI substrate showing the arrangement of the semiconductor islands SA in the region in which the driver circuit DRV is formed. The unit transistors Qu provided in this drawing have a common emitter width of 0.3 µm. Their common emitter length is 5 µm or an integral multiple of 5 µm.

In the region in which npn transistor Q1 is formed, the semiconductor islands SA are grouped into twelve pairs, so twenty-four semiconductor islands SA in total are disposed in a regular matrix arrangement. Transistor Q1 includes twenty-four unit transistors Qu because one unit transistor Qu is assumed to have an optimal collector current value of 1 mA and transistor Q1 requires 24-mA collector current. Semiconductor islands SA1 are paired because providing a base electrode common to a unit transistor pair, as described later, can reduce the layout area of the group of semiconductor islands SA1. It is also possible to define a pair of unit transistors Qu as one unit transistor. The arrangement of semiconductor islands SA1 for npn transistors Q3 and Q4 is the same as that for transistor Q1, so a description will be omitted.

Twelve semiconductor islands SA2 are disposed in the region in which pnp transistor Q2 is formed. Each semiconductor island SA2 includes two unit transistors Qu. More specifically, for the same reason as for transistor Q1, transistor Q2 also includes twenty-four unit transistors Qu. Similarly, a pair of unit transistors Qu are disposed in one semiconductor island SA2 to reduce the layout area of the group of semiconductor islands SA2. It is also possible to define a pair of unit transistors Qu in one semiconductor island SA2 as one unit transistor.

The region in which pnp transistor Q5 is formed includes four semiconductor islands SA2 similar to those described above that are disposed in the row direction (X direction) of FIG. 9. That is, transistor Q5 includes eight unit transistors Qu to obtain the required 8-mA collector current. The arrangement of semiconductor islands SA2 of pnp transistor Q8 is the same as that for transistor Q5, so a description will be omitted.

In the region in which npn transistor Q6 is formed, four pairs of semiconductor islands SA1, or eight semiconductor islands in total, are disposed in the row direction (X direction) of FIG. 9. That is, transistor Q6 includes eight unit transistors Qu to obtain the required 8 mA collector current.

In the region in which transistor Q7 is formed, eight semiconductor islands SA1 are disposed adjacent to each other with substantially identical spacing in the row direction (X direction) of FIG. 9. Transistor Q7 includes eight unit transistors Qu to obtain the required 8-mA collector current.

One semiconductor island SA2 is disposed in the region in which transistor Q9 is formed. Transistor Q9 includes two unit transistors Qu. The formation region of npn transistor Q10 includes two paired semiconductor islands SA1. Transistor Q10 includes two unit transistors Qu.

Figure 10:
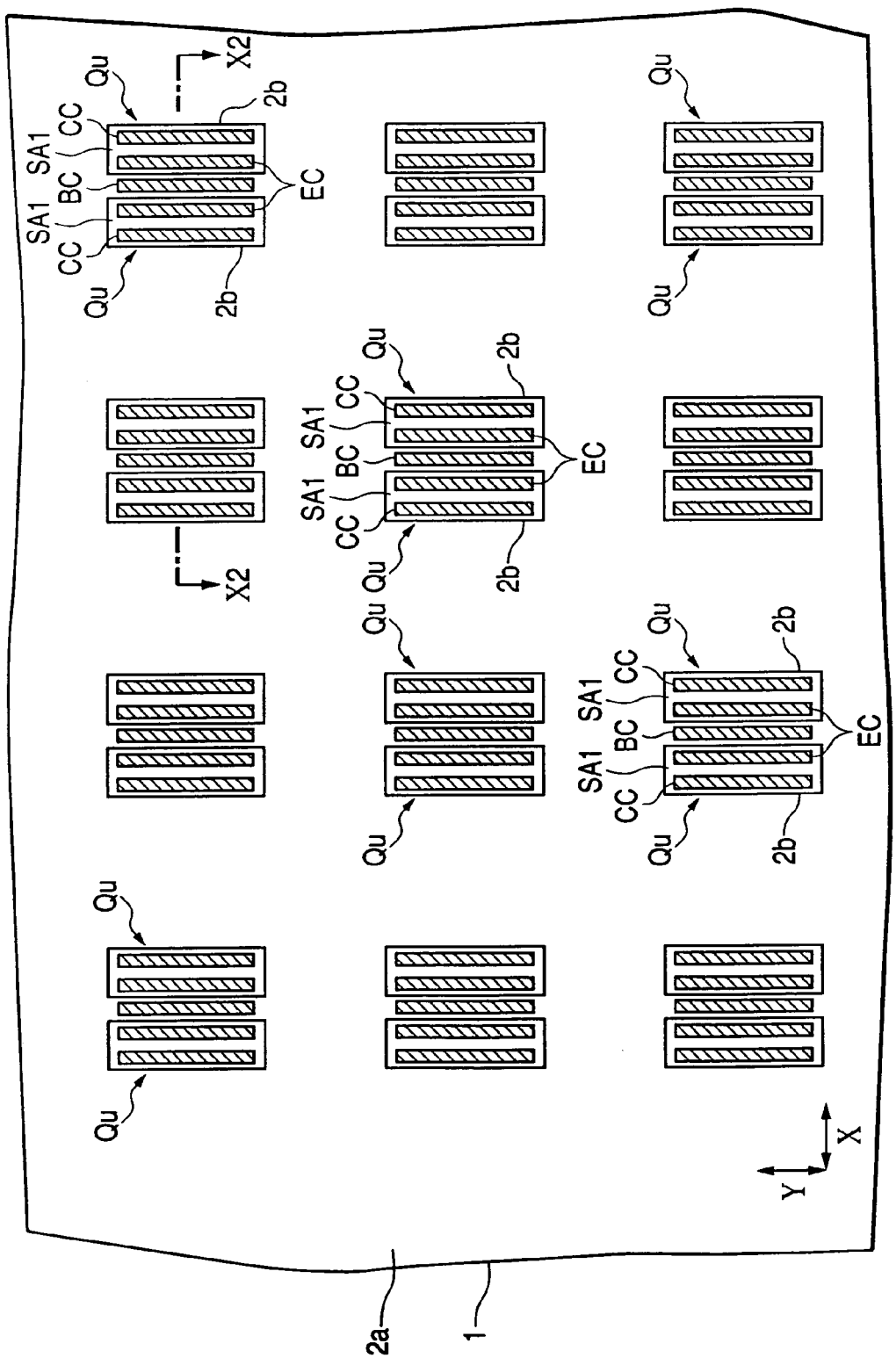
FIG. 10 is a plan view of the main part of an SOI substrate showing the region in which bipolar transistors are formed in the semiconductor device shown in FIGS. 8 and 9.

Next, the configuration of npn transistor Q1 will be described in detail with reference to FIGS. 10 to 14. FIG. 10 is a plan view of the main part of the SOI substrate in the formation region of transistor Q1, which is a layout plan view showing the plane positional relationships of semiconductor islands SA1 to contact holes BC, EC, and CC. Each region of a semiconductor island pair includes emitter contact holes EC and collector contact holes CC. A base contact hole BC is disposed in the space between the adjacent semiconductor islands SA1 of the pair and the shallow groove isolation part 2a.

Figure 11:
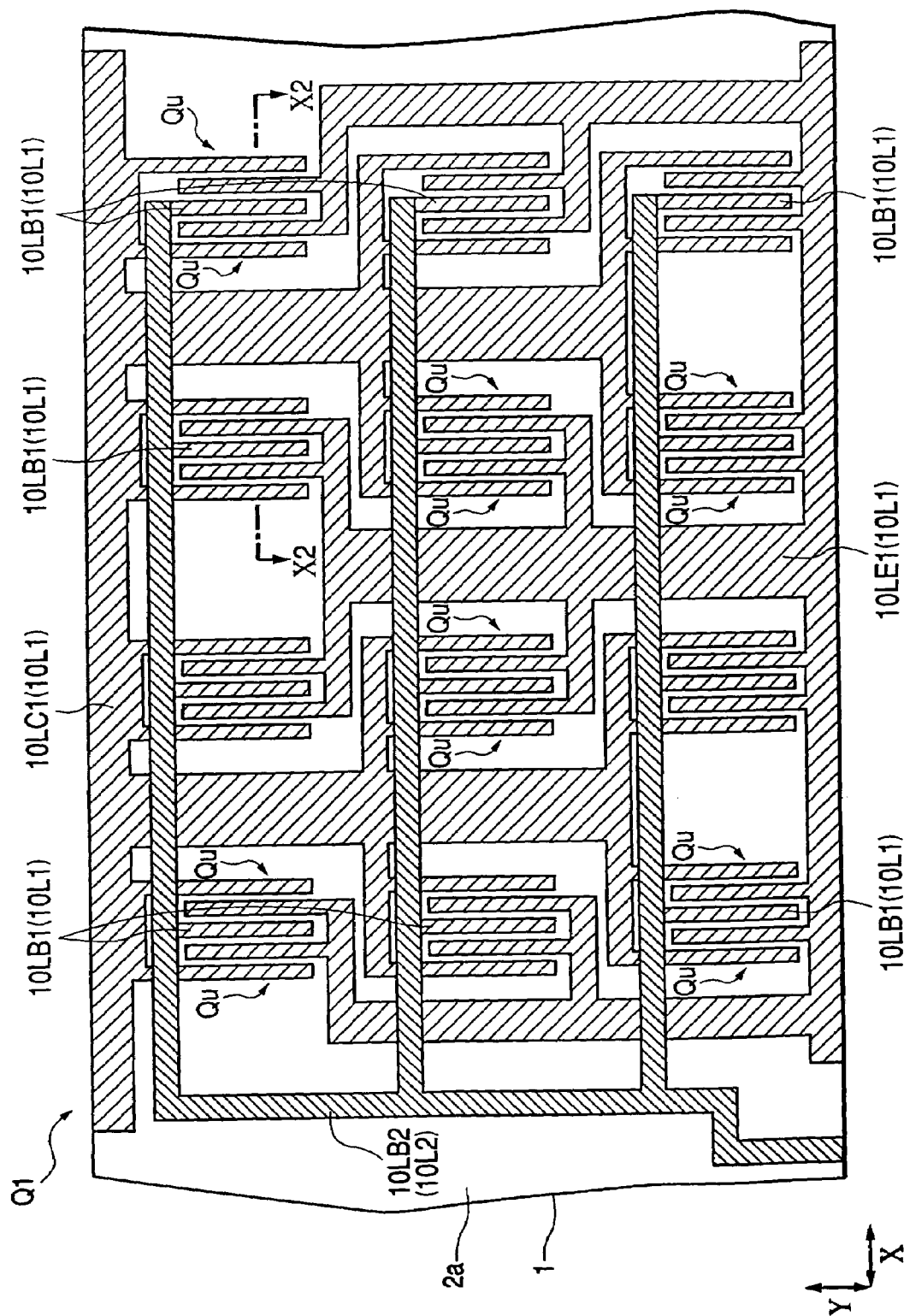
FIG. 11 is a plan view of the main part of an SOI substrate showing the arrangement of the first and second layer wiring in the same position as that shown in FIG. 10.
Figure 12:
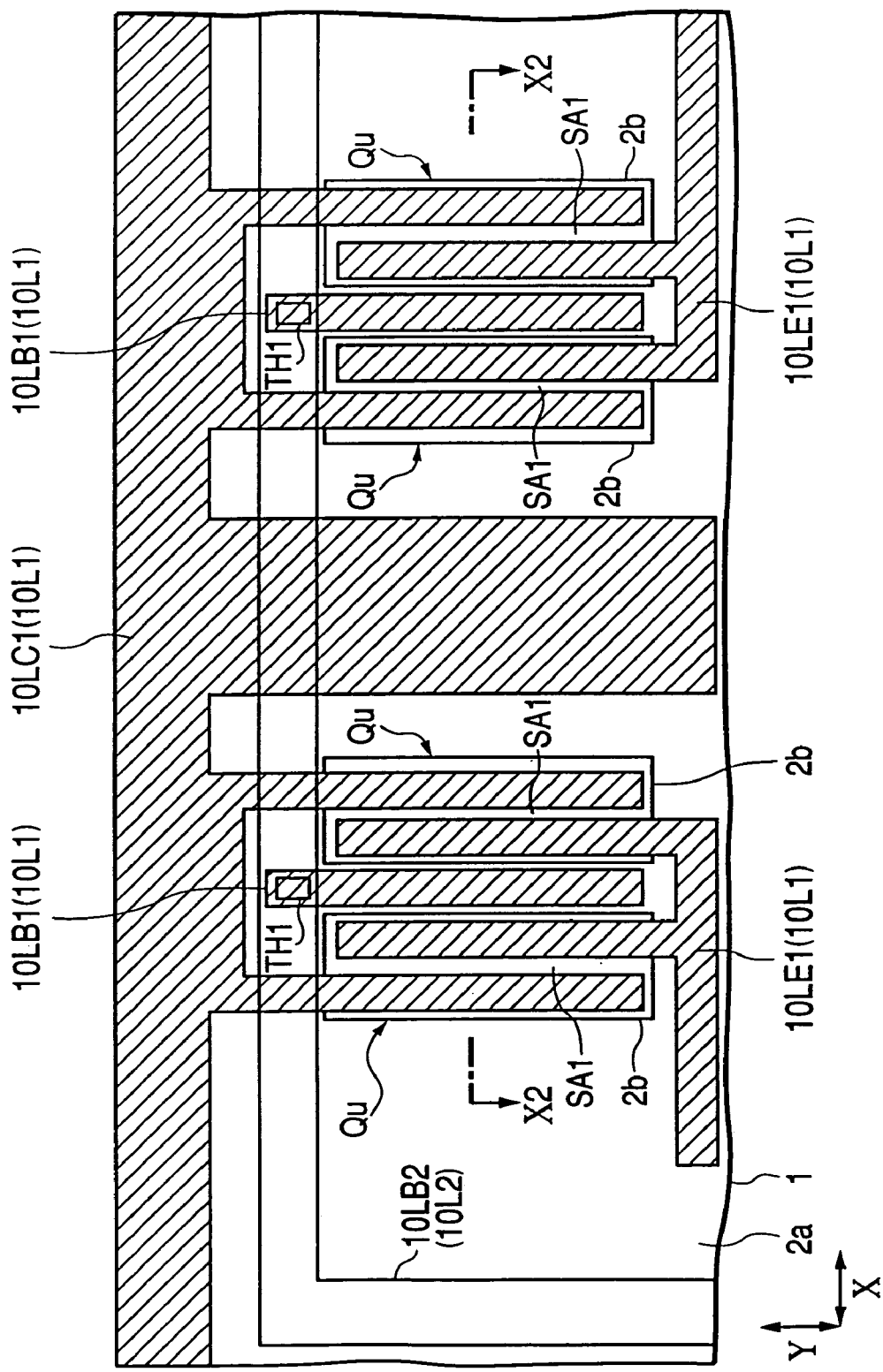
FIG. 12 is an enlarged plan view of the main part of FIG. 11, which is an enlarged plan view of the SOI substrate showing the overlapped view of the semiconductor islands and the first and second layer wiring
Figure 13:
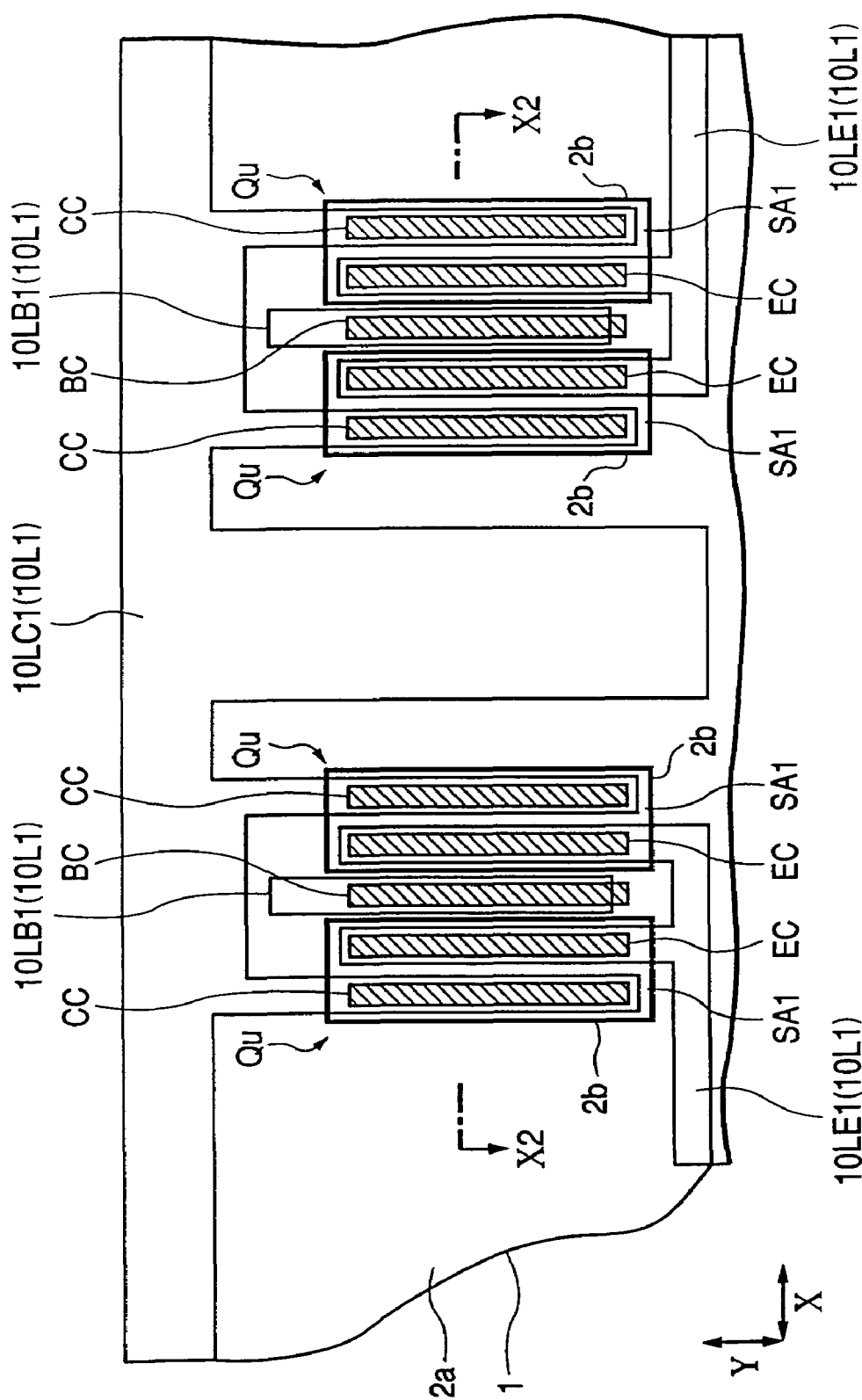
FIG. 13 is a plan view of the main part of an SOI substrate showing a flatbed alignment of the first layer wiring and the semiconductor islands in FIG. 12.

FIG. 11 is a layout plan view of the first layer wiring 10L1 and the second layer wiring. 10L2 at the same place shown in FIG. 10; FIG. 12 is an enlarged plan view of the main part of FIG. 11, which is a plan view showing an overlapped layout of semiconductor island SA1, the first layer wiring 10L1, and the second layer wiring 10L2; and FIG. 13 is a layout plan view showing the plane positional relationships of the first layer wiring 10L1, semiconductor island SA1, and contact holes BC, EC, and CC shown in FIG. 12.

The collectors of the plurality of unit transistors Qu disposed in the matrix are electrically interconnected through first layer wiring 10LC1 (10L1). The first layer wiring for collector 10LC1 has a row-direction (X-direction) wide-width wiring portion and column-direction (Y-direction) wide-width wiring portions intersecting at right angles with the row-direction wiring. More specifically, some parts of the row-direction wide-width wiring portion extend in the column direction and are electrically connected to the collectors of the plurality of unit transistors Qu disposed in the row direction. Some parts of the column-direction wide-width wiring portion extend to the space above the collectors of unit transistors Qu in adjacent paired semiconductor islands SA1 and are electrically connected with them through the applicable contact holes CC.

The emitters of the matrix of unit transistors Qu are electrically interconnected through first layer wiring 10LE1 (10L1). The first layer wiring for emitter 10LE1 is interleaved with the first layer wiring for collector 10LC1. More specifically, the first layer wiring for emitter 10LE1 also has a row-direction (X-direction) wide-width wiring portion and a column-direction (Y-direction) wide-width wiring portion intersecting the row-direction wiring at right angles. Some parts of the row-direction wide-width wiring portion extend in the column direction and are electrically connected to the emitters of the plurality of unit transistors Qu disposed in the row direction. Some parts of the column-direction wide-width wiring portion extend to the space above the emitters in adjacent paired semiconductor islands SA1 and are electrically connected with the emitters through the contact holes EC.

The bases of the matrix of unit transistors Qu are electrically interconnected through first layer wiring 10LB1 (10L1), and are further electrically interconnected by second layer wiring 10LB2 (10L2) for bases in a layer above the first layer wiring 10L1 via through holes TH1.

Figure 14:
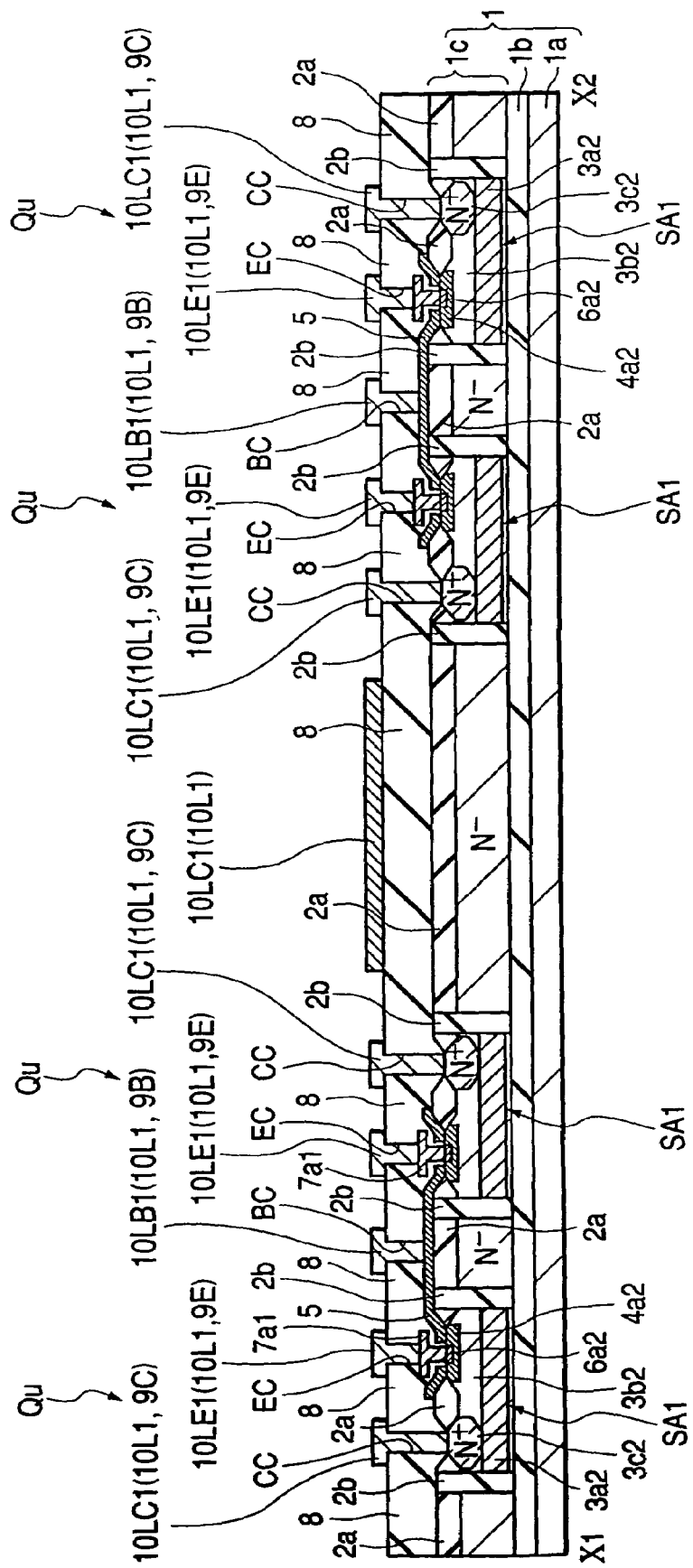
FIG. 14 is a sectional view through line X2—X2 of FIGS. 10 to 13.

FIG. 14 is a sectional view through line X2—X2 of the drawings shown in FIGS. 10 to 13. A pair of semiconductor islands SA1 are electrically isolated from each other by a deep groove isolation part 2b. Therefore, in the semiconductor layer 1c, two unit transistors Qu included in each of the paired semiconductor islands SA1 are electrically isolated from each other. The base electrode 9B (first layer wiring for bases 10LB1), however, is shared by the two unit transistors Qu. More specifically, the base lead electrodes 5 of the two unit transistors Qu are extended onto the deep groove isolation part 2b in the space between the adjacent paired semiconductor islands SA1 and are integrally patterned and electrically interconnected. The integrally patterned base lead electrodes 5 are electrically connected to one base electrode 9B (first layer wiring for bases 10LB1) through the contact hole BC. In this way, the base electrode 9B commonly used by the two unit transistors Qu is provided, which can reduce the spacing between the adjacent two unit transistors Qu, thereby enabling a reduction of the total layout area occupied by the plurality of unit transistors Qu. Other structural features are the same as those described with reference to FIG. 2(c).

Figure 15:
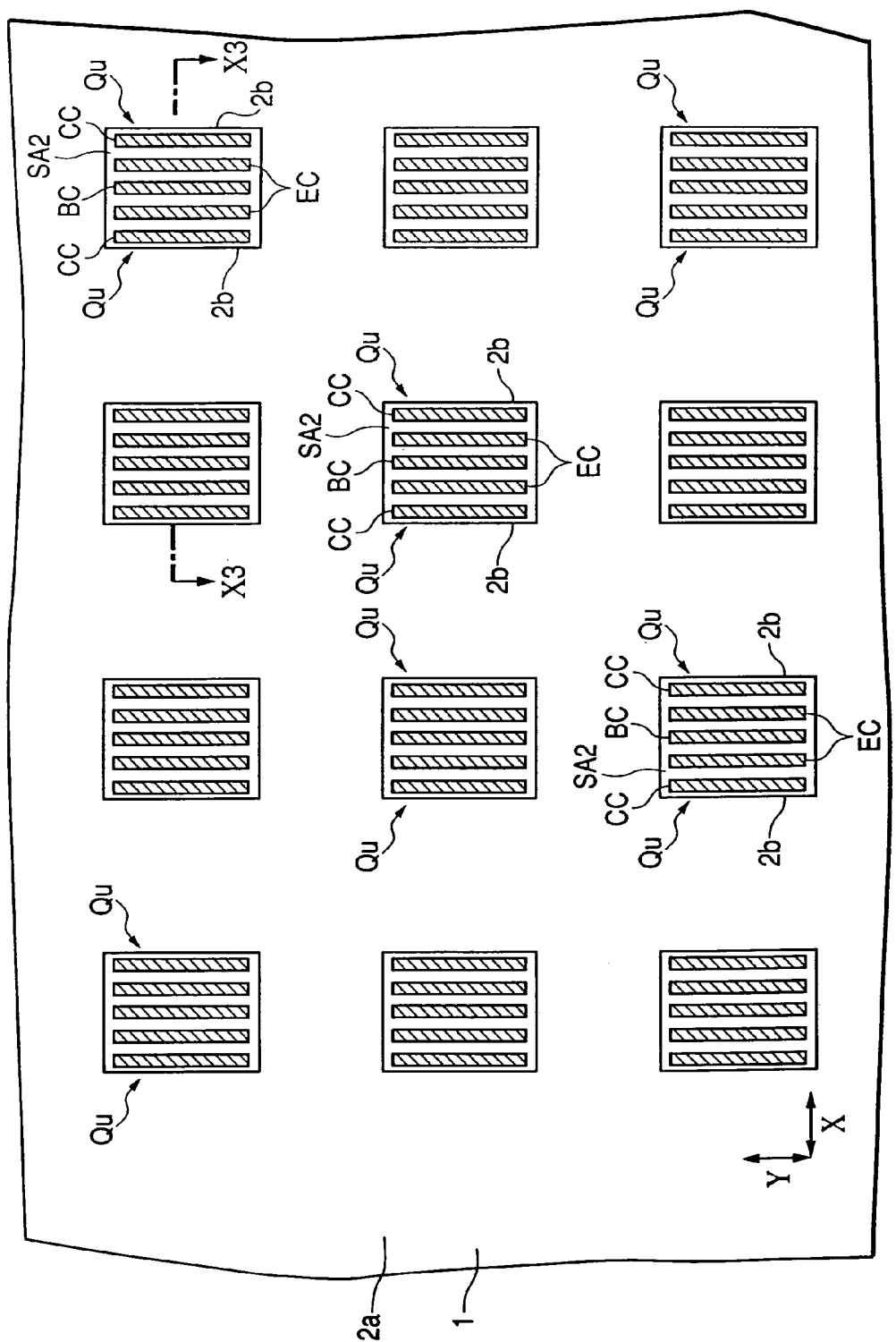
FIG. 15 is a plan view of the main part of an SOI substrate in the formation region of given bipolar transistors of FIGS. 8 and 9.

The configuration of transistor Q2 will now be described in detail with reference to FIG. 15 to 19. FIG. 15 is a plan view of the main part of the SOI substrate in the region in which transistor Q2 is formed, showing the layout of this region and the positional relationships of the semiconductor island SA2, and contact holes BC, EC, and CC. One semiconductor island SA1 includes one base contact hole BC, two emitter contact holes EC, and two collector contact holes CC. The base contact hole BC is disposed at the center of the semiconductor island SA2. The emitter contact holes EC are disposed on both sides of the base contact hole BC, and the collector contact holes CC are disposed on further outer both sides thereof.

Figure 16:
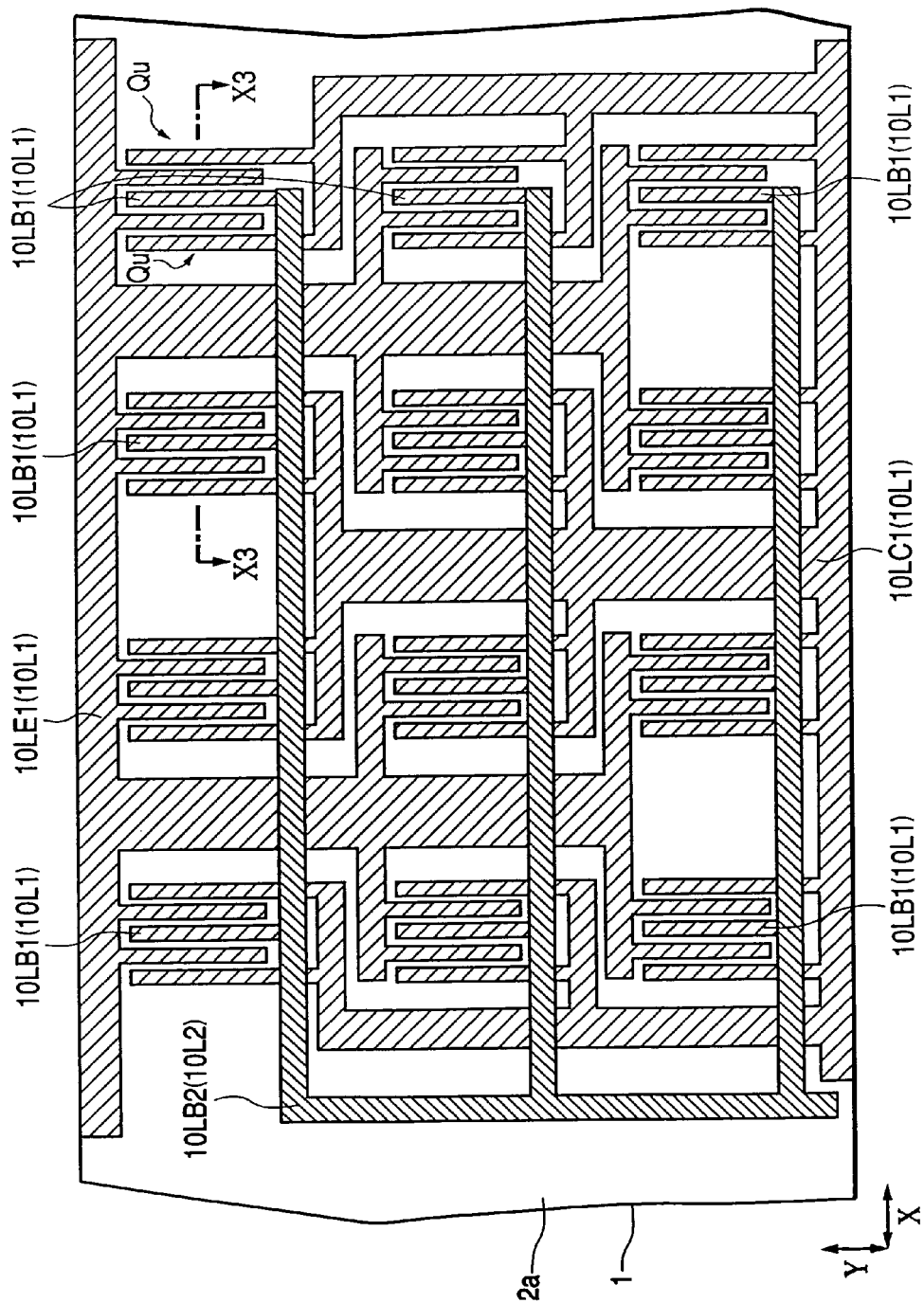
FIG. 16 is a plan view of the main part of an SOI substrate showing the arrangement of the first and second layer wiring at the same position as in FIG. 15.
Figure 17:
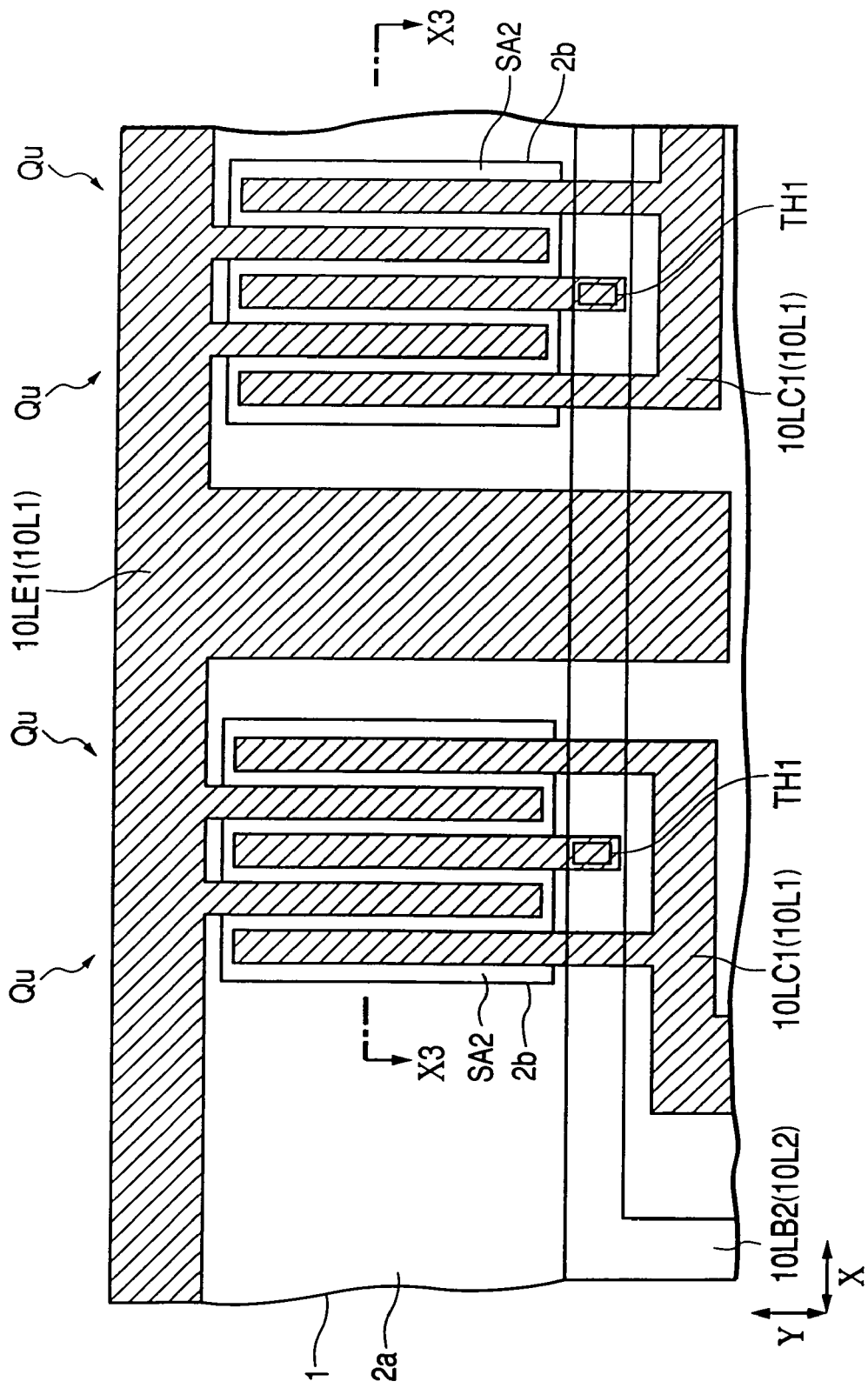
FIG. 17 is an enlarged plan view of the main part of an SOI substrate of FIG. 16 showing overlapping of the semiconductor islands and the first and second layer wiring.
Figure 18:
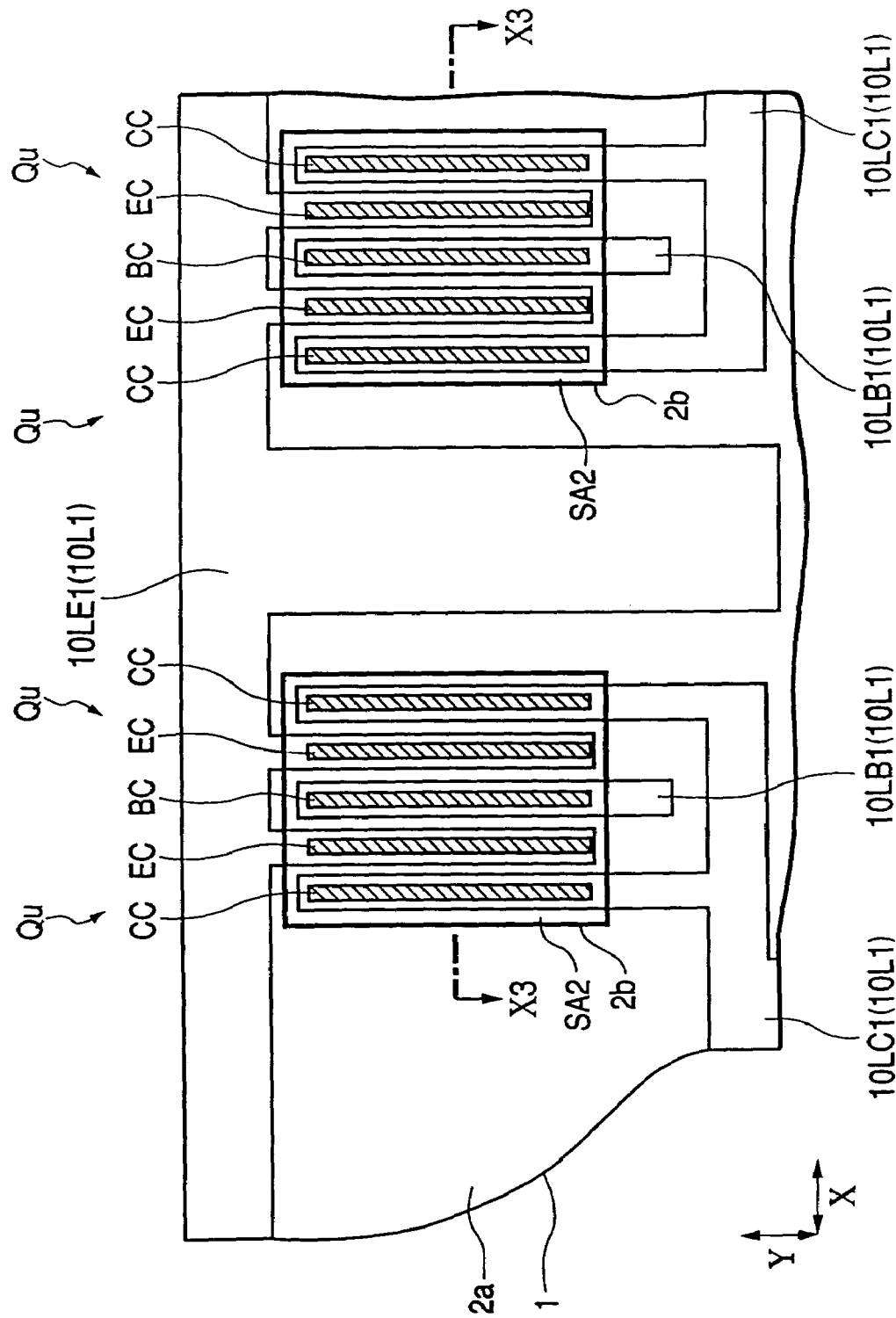
FIG. 18 is a plan view of the main part of an SOI substrate showing a flatbed alignment of the first layer wiring and the semiconductor islands.

FIG. 16 is a layout plan view of the first layer wiring 10L1 and the second layer wiring 10L2 at the same place as shown in FIG. 15; FIG. 17 is an enlarged plan view of the main part of the drawing of FIG. 16, which is a plan view showing an overlapped layout of the semiconductor island SA2, the first layer wiring 10L1, and the second layer wiring 10L2; and FIG. 18 is a layout plan view showing the positional relationships of the first layer wiring 10L1, the semiconductor island SA2, and the contact holes BC, EC, and CC. The wiring connection method of the first layer wiring 10L1 (10LC1, 10LE1, and 10LB1) and the second layer wiring 10L2 (10LB2) is the same as that described with reference to FIGS. 10 to 13, except that the locations of the first layer wiring for collectors 10LC1 and the first layer wiring for emitter 10LE1 are interchanged.

Figure 19:
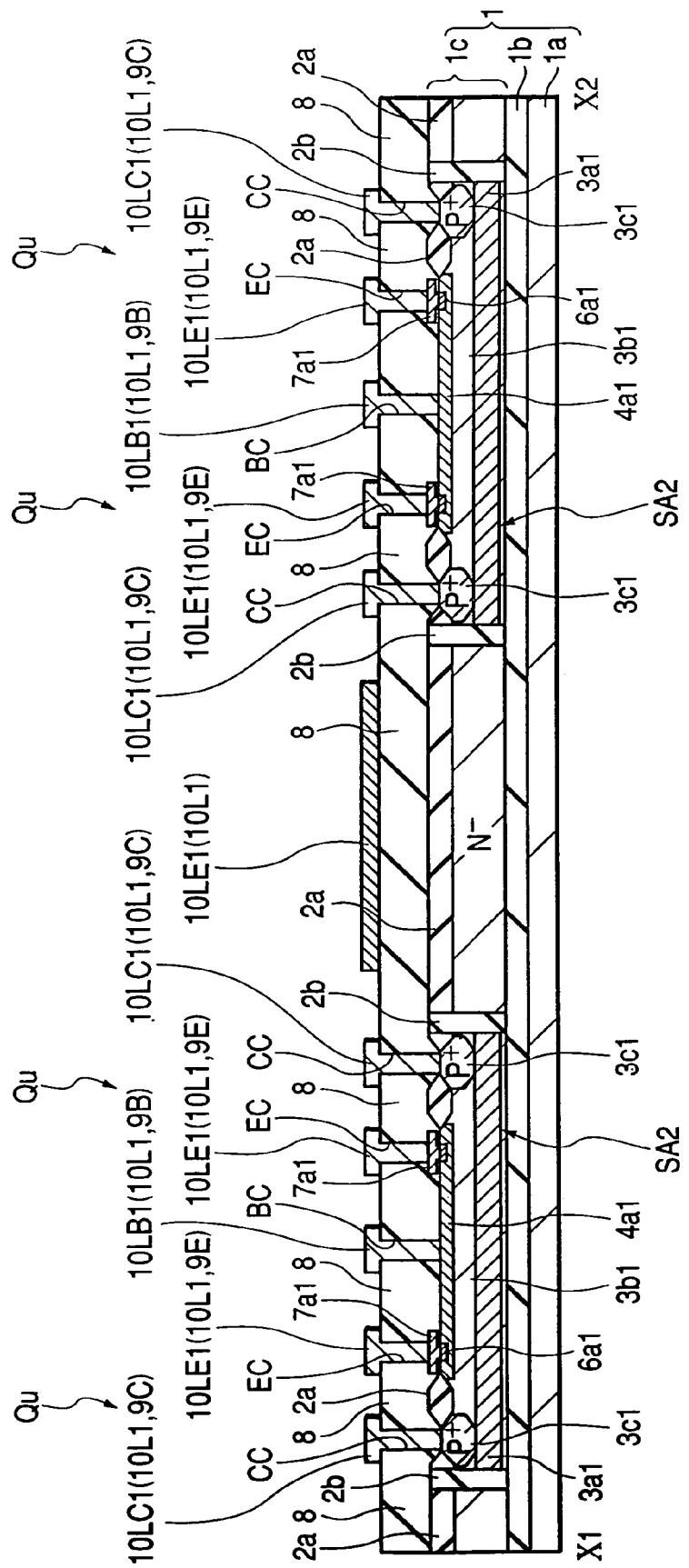
FIG. 19 is a sectional view through line X3—X3 of FIGS. 15 to 18.

FIG. 19 is a sectional view through line X3—X3 of the drawings shown in FIGS. 15 to 18. Two collector lead regions 3c1 are formed in a collector region 3b1 in one semiconductor island SA2 that is surrounded and isolated by the deep groove isolation part 2b and the semiconductor layer 1c. The two collector lead regions 3c1 are each electrically connected to a collector electrode 9C (first layer wiring for collectors 10LC1) through the contact hole CC. Two emitter regions 6a1 are formed separately in a base region 3b1 in the one semiconductor island SA2. The two emitter regions 6a1 are electrically connected to the emitter electrodes 9E (first layer wiring for emitters 10LE1) through the emitter electrodes 7a1 and the contact holes EC. A base region 4a1 is electrically connected to the base electrode 9B (the first layer wiring for bases 10LB1) through the contact hole BC disposed between two emitter regions 6a1. Other structural features are the same as those described with reference to FIG. 2(a).

Figure 20:
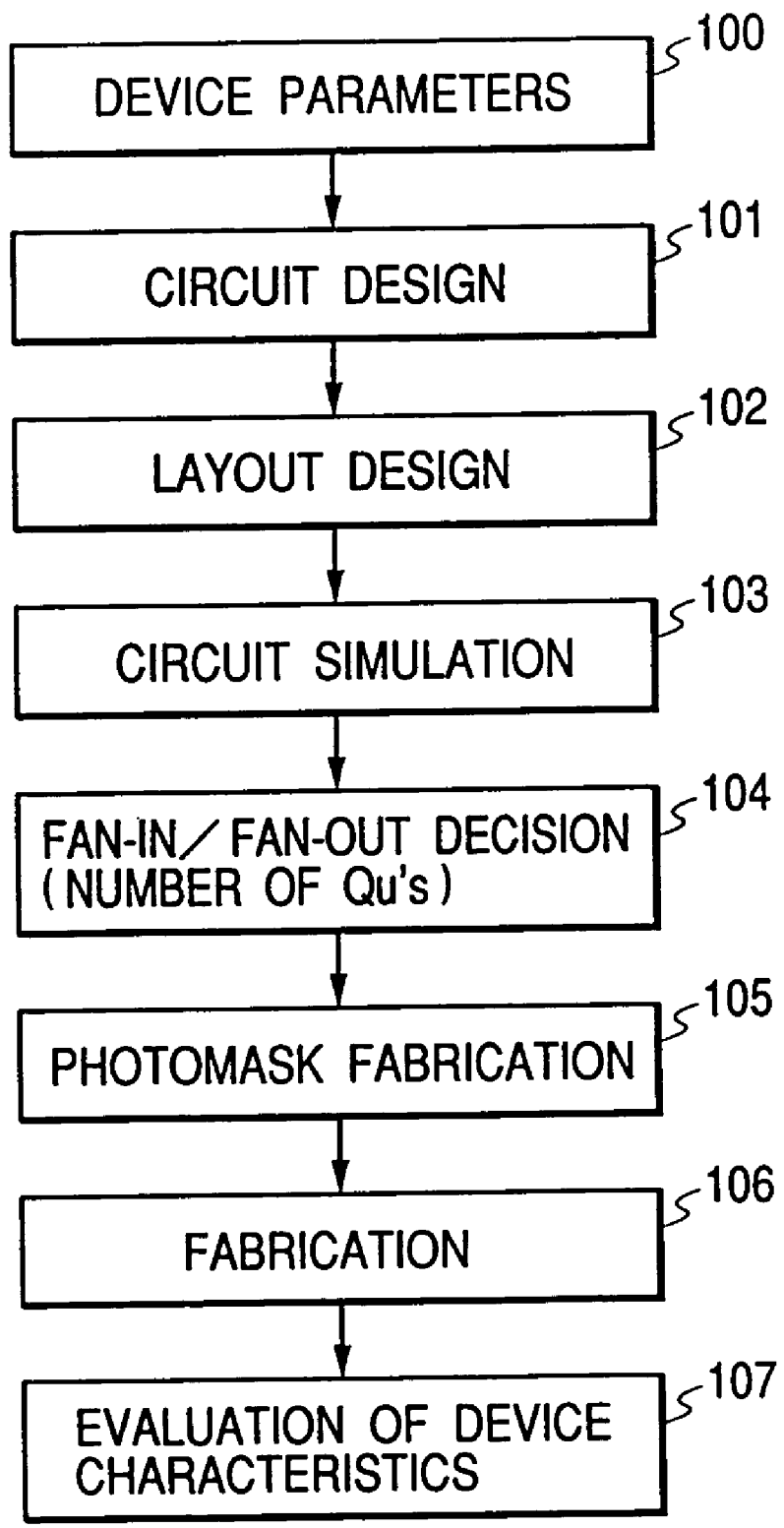
FIG. 20 is a flow diagram showing the fabricating steps of a semiconductor device according to an embodiment of the present-invention.

Next, an example of a method of fabricating a semiconductor device according to this embodiment will be described with reference to FIG. 20.

First, the device parameters such as resistances and capacitances required to design a semiconductor device are determined (step 100). The device parameters indicate electrical characteristics of elements (transistors in this case) in the semiconductor device, such as values of resistance, capacitance (including parasitic capacitance), breakdown voltages, and various kinds of currents, which become reference values in the circuit design. Next, a desired semiconductor integrated circuit is designed on the basis of the device parameters (step 101). In this example, the transistor-level circuit configuration and device characteristics are determined. Then, based on the circuit diagram prepared in the circuit design step, circuit components are laid out and wired (step 102). In this step, the plurality of unit transistors Qu are arranged on a layout plane and interconnected by wiring to form predetermined transistors (transistors Q1 to Q10). At this time, a few more unit transistors than required to configure the transistor are disposed in the formation region of each transistor (transistors Q1 to Q10). After that, the expected amounts of parasitic capacitance and resistance are extracted; then a circuit simulation is carried out (step 103).

Next, based on the parasitic capacitance and resistance values of the semiconductor device that have been determined in the circuit simulation step, the number of unit transistors Qu to be connected in parallel in each of large-current transistors (transistors Q1 to Q10) is determined (step 104). In this case, the values of parasitic capacitance and resistance are adjusted by controlling the number of unit transistors Qu to be connected to the circuitry. There is a case in which circuit simulation of a designed semiconductor device, for example, exhibits values of parasitic capacitance or resistance over the allowable values for the semiconductor device. In that case, the values of the parasitic capacitance or resistance can be reduced by disconnecting some of the unit transistors Qu from the circuitry. The reason for including a few more unit transistors Qu than required in designing the layout (step 102), is to allow for the case in which this type of minor modification is necessary, or enable capacitance and other parameters to be adjusted simply by connecting or disconnecting unit transistors Qu.

In the technology the present inventors have examined, in which a large-current transistor is configured with one (type of) transistor without using unit transistors, if a modification is required due to parasitic capacitance or other factors, it is necessary to return to the step of arranging the elements, or the layout design step. This is a complicated process, causing a long delay in layout design, whereas the present embodiment permits such modifications to be made just by disconnecting the extra unit transistors Qu increasing the parasitic capacitance from the circuit. Disconnection of a unit transistor Qu can be carried out just by eliminating a contact hole through which the unit transistor Qu is connected with its wiring, for example, or by eliminating the wiring partially. In either case, all that has to be done is to change part of the wiring, which can be done relatively easily, resulting in substantially shortened design time.

After the adjustment is carried out, the applicable photolithography masks are formed based on the design drawings (step 105). The device pattern is formed on a wafer (SOI substrate) by exposure processing using the photolithography masks to fabricate the semiconductor device (step 106). After that, the characteristics of the fabricated semiconductor device (semiconductor chip) are evaluated (step 107).

Second Embodiment

Figure 21:
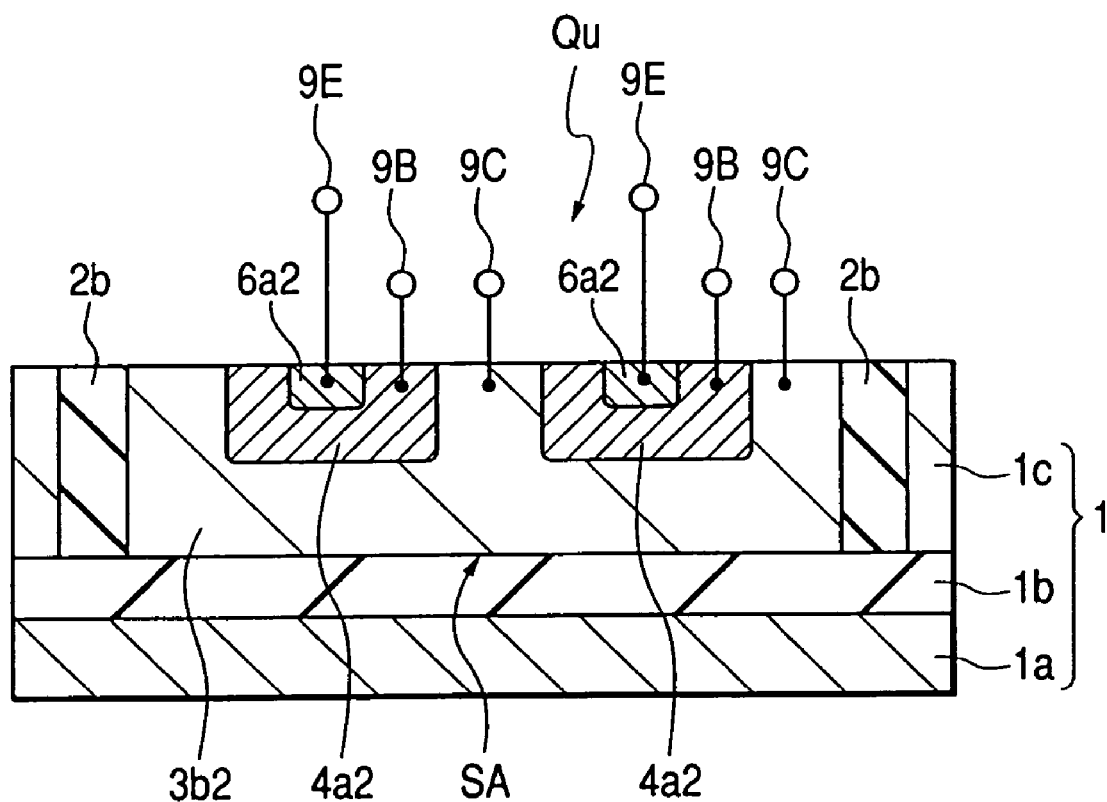
FIG. 21 is a sectional view of the main part of a semiconductor device according to another embodiment of the present invention.

A variation of a unit transistor according to this embodiment will be described below. FIG. 21 is a sectional view of the main part of a unit transistor Qu of the npn type according to this embodiment. In this embodiment, two base regions 4a2 are provided in the collector region in the semiconductor island SA surrounded and isolated by the deep groove isolation part 2b and insulating layer 1b, and an emitter region 6a2 is provided in each base region 4a2. It is also possible to provide four or more base regions 4a2 and emitter regions 6a2.

Figure 22:
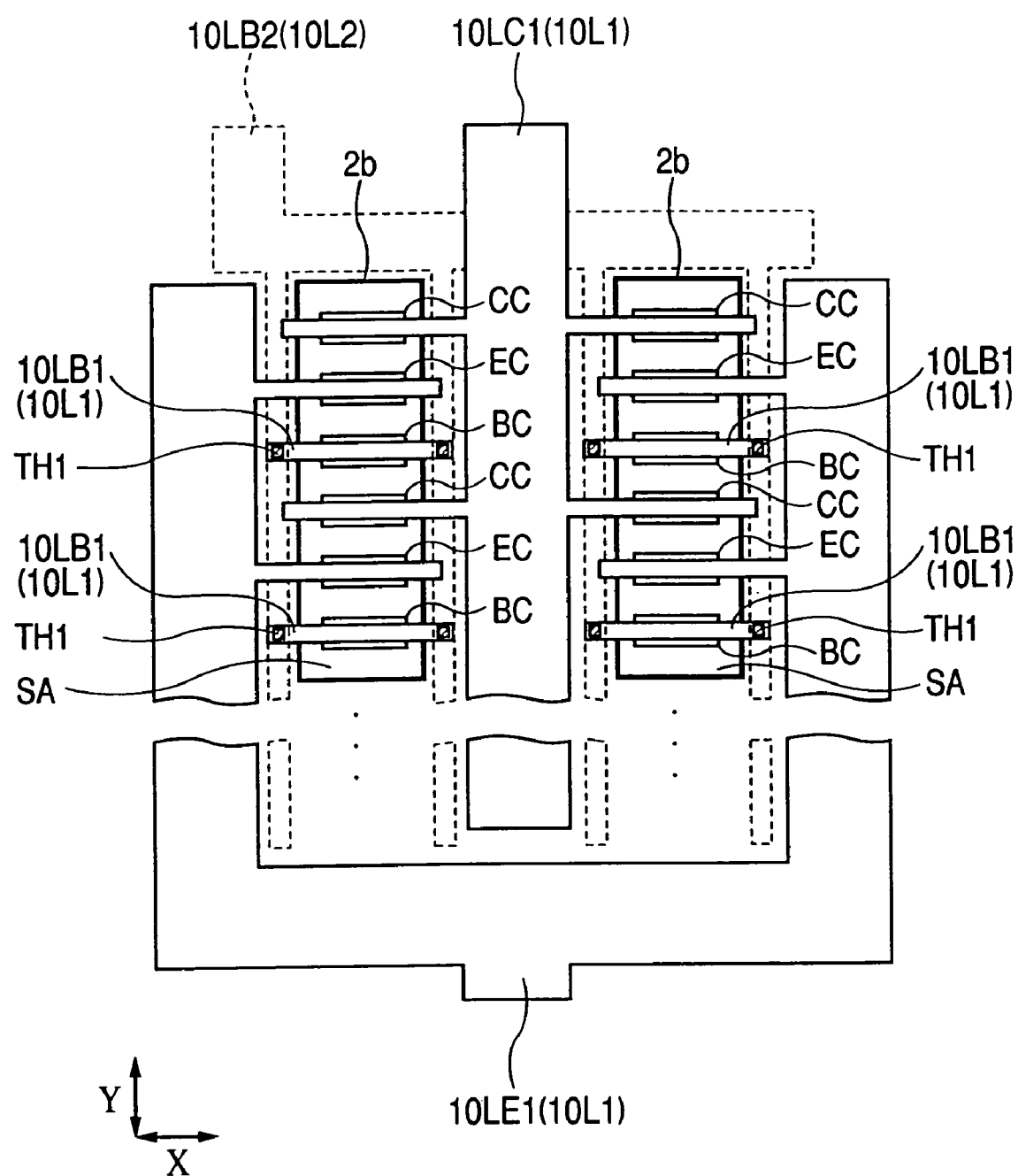
FIG. 22 is a plan view of the main part of the semiconductor device shown in FIG. 21.
Figure 23:
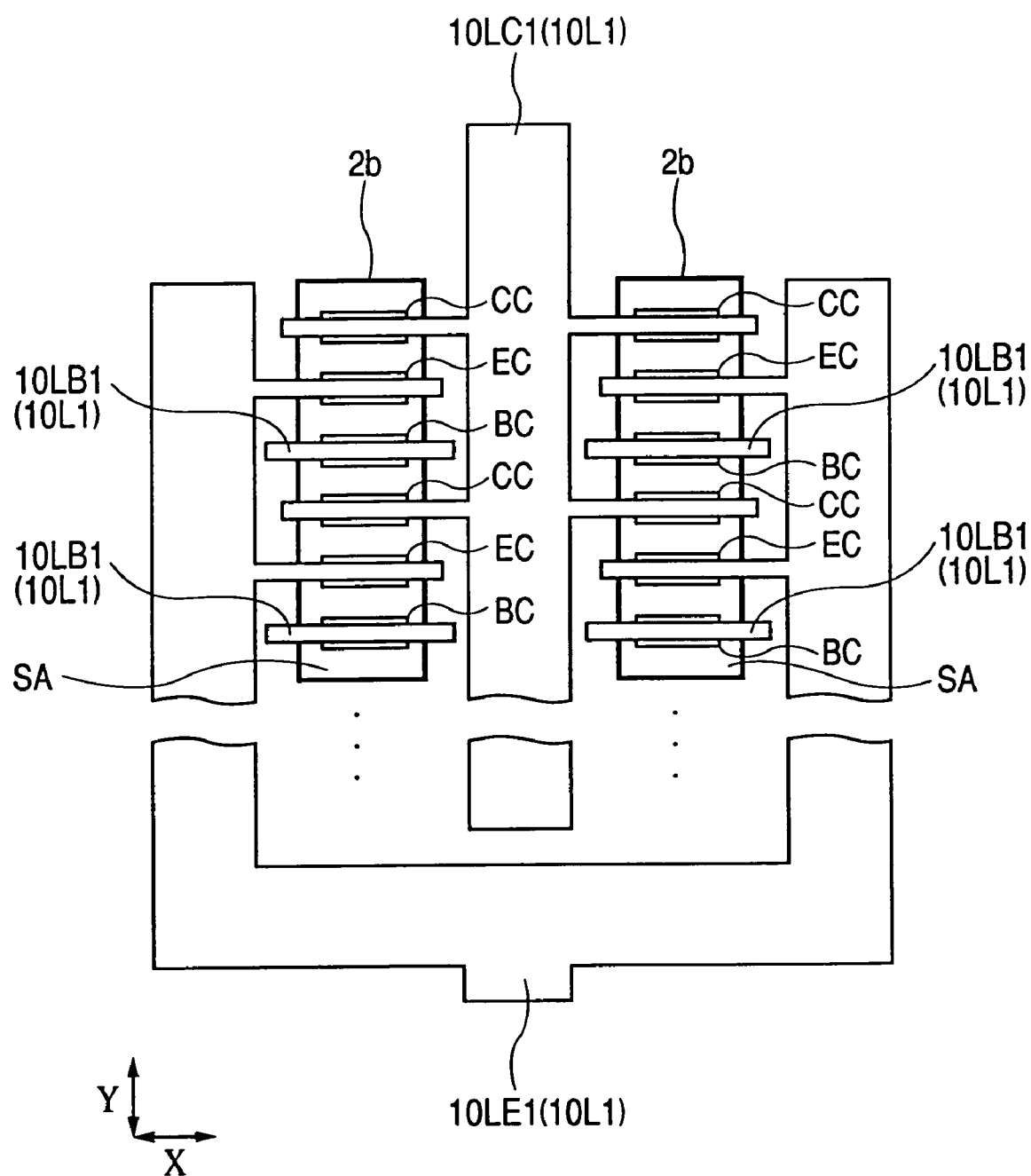
FIG. 23 is a plan view of the main part of the semiconductor device shown in FIG. 21.

FIGS. 22 and 23 are plan views of the examples, showing plan views of unit transistors Qu. FIG. 22 is an overlapped view of the semiconductor island SA, the first layer wiring 10L1, and the second layer wiring 10L2; and FIG. 23 is an overlapped view of the semiconductor island SA and the first layer wiring 10L1.

According to this embodiment, one unit transistor Qu in one semiconductor island SA is configured by connecting two npn small-current transistors in parallel. Therefore, one semiconductor island SA includes two bases, two emitters, and two collectors. One possible emitter width of a small-current transistor included in a unit transistor Qu is 0.3 μm, and a possible emitter length is 10 μm. Twenty-five unit transistors Qu of this type are laid out to form one large-current transistor.

A plurality of semiconductor islands SA are disposed along the column direction (Y direction) of the drawings shown in FIGS. 22 and 23. The wide-width wiring portions of the first layer wiring for collectors 10LC1 (10L1) and first layer wiring for emitters 10LE1 (10L1) are disposed on both sides of the column of the semiconductor islands SA, respectively. That is, the wide-width portions of the first layer wiring for collectors 10LC1 and first layer wiring for emitters 10LE1 are interleaved.

Some parts of the wide-width wiring portion of the first layer wiring for collectors 10LC1 are extended in the row direction (X direction) of the drawing shown in FIGS. 22 and 23 to the space above the collector of each unit transistor Qu and are electrically connected to the collector lead region through the contact holes CC, by which the collectors of the unit transistors Qu are electrically interconnected. Some part of the wide-width wiring portion of the emitter first layer wiring 10LE1 are also extended in the row direction (X direction) of the drawing shown in FIGS. 22 and 23 to the space above the emitter of each unit transistor Qu and are electrically connected to the emitter region through emitter contact holes EC, by which the emitters of the unit transistors Qu are electrically interconnected. Although the widths of the contact holes BC, EC, and CC are drawn wider than those of the first layer wiring for bases 10LB1, first layer wiring for emitters 10LE1, and first layer wiring for collectors 10LC1 for legibility in this drawing, the widths of contact holes BC, EC, and CC are actually narrower then those of the first layer wiring for bases 10LB1, first layer wiring for emitters 10LE1, and first layer wiring for collectors 10LC1.

The base region 4a2 is electrically connected to the first layer wiring for bases 10LB1 through base contact hole BC. The first layer wiring for bases 10LB1 comprises a short flat band-shaped pattern in the row direction of the drawing shown in FIGS. 22 and 23. The first layer wiring for bases 10LB1 of each unit transistor Qu is electrically connected to the second layer wiring for bases 10LB2 (10L2) in a layer above the first layer. This interconnects the bases of the unit transistors Qu. A structure in which bases are led with relatively thin wiring of the first layer wiring for bases 10LB1 and second layer wiring for bases 10LB2 is employed because base current is smaller than collector and emitter current.

Although our invention has been specifically described in the above related embodiments, it is to be understood that the invention is not limited to the embodiments described above, and various changes and modifications may be made in the invention without departing form the spirit and scope thereof.

For example, although the embodiments are described on the assumption of an ordinary wiring structure, this is not a limitation. It is also possible to employ so-called damascene wiring structures in which wiring and plugs are formed by filling conductor films into grooves formed in an insulating film or by a dual-damascene method in which the same conductor material is filled into wiring grooves and holes.

An SOI substrate that has no base substrate, such as a silicon-on-sapphire (SOS) substrate, may be used in place of the SOI substrate employed in the embodiments.

In addition, the method of fabricating an SOI substrate is not limited to the wafer bonding method; various other methods are possible. For example, it is possible to employ the so-called separation-by-implanted-oxygen (SIMOX) method in which an insulating layer is formed by implanting oxygen ions into a semiconductor substrate.

Our invention has been described above in relation to the application field of analog-digital mixed-signal circuits, but this is not a limitation. The present invention can be applied to semiconductor devices in which memory circuits such as a dynamic random access memory (DRAM), static random access memory (SRAM), or electrically erasable programmable read-only memory (EEPROM) and flash memory circuits are formed on the same type of SOI substrate.

The effects obtainable by typical embodiments of the invention disclosed herein can be summarized as follows.

The present invention configures a bipolar transistor requiring high current capacity through parallel interconnection of a plurality of unit bipolar transistors that are completely electrically isolated from each other in the semiconductor layer of an SOI substrate, making it possible to design most types of large-current transistors by using only one or two types of unit transistors, resulting in a reduced number of semiconductor device design steps.

What is claimed is:

1. A semiconductor device comprising:
   a silicon-on-insulator substrate including a base substrate, an insulating layer over the base substrate, and a semiconductor layer over the insulating layer;
   an electric circuit formed over the silicon-on-insulator substrate;
   a plurality of semiconductor islands used as element-forming regions in a first area of the silicon-on-insulator substrate; and
   a plurality of first bipolar transistors formed in the respective semiconductor islands, and each respectively having an emitter region, a base region, and a collector region formed in the semiconductor layer;
   wherein the plurality of semiconductor islands are isolated from each other by grooves for isolating elements, the grooves reaching the semiconductor layer which become a buried oxide layer of the silicon-on-insulator substrate; and
   the emitter regions, the base regions, and the collector regions of the plurality of the first bipolar transistors are electrically parallel-connected by interconnection wirings respectively to act simultaneously and act as a large transistor.

2. The semiconductor device according to claim 1, wherein the semiconductor islands are substantially same in size.

3. The semiconductor device according to claim 1, wherein the first bipolar transistor is a unit bipolar transistor constituting the singular bipolar transistor.

4. The semiconductor device according to claim 1, wherein the silicon-on-insulator substrate further includes a second area; and
   A MOSFET is formed in the second area.

5. A semiconductor device comprising:
   a silicon-on-insulator substrate including a base substrate, an insulating layer over the base substrate, and a semiconductor layer over the insulating layer;
   an electric circuit formed over the silicon-on-insulator substrate;
   a plurality of semiconductor islands used as element-forming regions, and being isolated from each other by grooves for isolating elements, the grooves reaching the semiconductor layer which become a buried oxide layer of the silicon-on-insulator substrate; and
   a plurality of first transistors formed in respective semiconductor islands, and each respectively having a first electrode, a second electrode, and a third electrode formed over the silicon-on-insulator substrate;
   wherein the first electrodes, the second electrodes, and the third electrodes of the plurality of the first transistors are electrically parallel-connected by interconnection wirings respectively to act simultaneously and act as a large transistor;
   the plurality of the first transistors function as a singular transistor; and
   the electric circuit includes the singular transistor.

6. The semiconductor device according to claim 5, wherein the semiconductor islands are substantially same in size; and
   the first transistor is a unit transistor constituting the singular transistor.

7. The semiconductor device according to claim 6, wherein the transistor is a bipolar transistor; and
   the first electrode, the second electrode, and the third electrode are an emitter electrode, a base electrode, and a collector electrode of the bipolar transistor respectively.

* * * * *